US012200155B2

(12) United States Patent
Paddick et al.

(10) Patent No.: US 12,200,155 B2
(45) Date of Patent: Jan. 14, 2025

(54) TELECOMMUNICATIONS ENCLOSURE

(71) Applicant: Prysmian S.p.A., Milan (IT)

(72) Inventors: Nathan Paddick, Bishopstoke (GB);
Andrew Barnes, Bishopstoke (GB)

(73) Assignee: PRYSMIAN S.P.A., Milan (IT)

( * ) Notice: Subject to any disclaimer, the term of this patent is extended or adjusted under 35 U.S.C. 154(b) by 188 days.

(21) Appl. No.: 17/880,267

(22) Filed: Aug. 3, 2022

(65) Prior Publication Data

US 2023/0045054 A1 Feb. 9, 2023

(30) Foreign Application Priority Data

Aug. 4, 2021 (IT) .................. 102021000021113

(51) Int. Cl.
| | |
|---|---|
| *H05K 7/18* | (2006.01) |
| *H04M 1/02* | (2006.01) |
| *H04M 1/03* | (2006.01) |
| *H04M 1/15* | (2006.01) |

(52) U.S. Cl.
CPC ........... *H04M 1/0293* (2013.01); *H04M 1/03* (2013.01); *H04M 1/15* (2013.01); *H05K 7/186* (2013.01)

(58) Field of Classification Search
CPC ........ H04M 1/0293; H04M 1/03; H04M 1/15; H05K 7/186
USPC .......................................................... 361/827
See application file for complete search history.

(56) References Cited

U.S. PATENT DOCUMENTS

| | | | | |
|---|---|---|---|---|
| 5,502,282 | A | * | 3/1996 | Kunze ................. H02G 15/013 174/93 |
| 5,775,702 | A | * | 7/1998 | Laeremans .......... G02B 6/4471 174/152 G |
| 6,292,556 | B1 | * | 9/2001 | Laetsch ............. H05K 7/20445 379/338 |
| 8,207,445 | B2 | * | 6/2012 | Knorr ................. G02B 6/4444 174/93 |
| 9,316,804 | B2 | * | 4/2016 | Badura ............... H02G 15/113 |
| 10,180,553 | B2 | * | 1/2019 | Flores ................ G02B 6/4442 |
| 10,996,414 | B1 | * | 5/2021 | Kimbrell ........... G02B 6/44775 |
| 11,002,929 | B2 | * | 5/2021 | Geens ................ H02G 15/013 |
| 11,300,745 | B2 | * | 4/2022 | Aznag ................ H02G 15/013 |
| 11,561,354 | B2 | * | 1/2023 | Wittmeier ........... G02B 6/4444 |
| 11,635,577 | B2 | * | 4/2023 | Hill ...................... G02B 6/4444 385/53 |
| D1,011,298 | S | * | 1/2024 | Thompson ................. D13/152 |
| 2003/0026415 | A1 | * | 2/2003 | Laetsch ............. H05K 7/20445 379/338 |
| 2003/0078015 | A1 | * | 4/2003 | Laetsch ............. H05K 7/20445 455/90.3 |

(Continued)

*Primary Examiner* — Anatoly Vortman
(74) *Attorney, Agent, or Firm* — Haynes and Boone, LLP

(57) ABSTRACT

Provided herein are a telecommunications enclosure (1) and a method for coupling a cable (6) to a cable port (15) of the telecommunications enclosure (1). The base (10) comprises an outer structure (11) having an inner opening (12), and an inner assembly (130) comprising an inner structure (13), adapted to be removably inserted within the inner opening (12), and a plurality of sealing modules (14), each comprising a first part (14*a*) and a second part (14*b*). The outer structure (11) comprises a plurality of receiving portions (16) each having a recess (161) adapted to receive at least said first part (14*a*) of a respective sealing module (14) of the plurality of sealing modules (14). The base (10) is commutable between an assembled condition and a disassembled condition.

11 Claims, 17 Drawing Sheets

(56) References Cited

U.S. PATENT DOCUMENTS

| | | | |
|---|---|---|---|
| 2005/0275319 A1* | 12/2005 | Wittmeier | H05K 7/186 |
| | | | 312/100 |
| 2009/0057008 A1 | 3/2009 | Knorr et al. | |
| 2015/0071598 A1* | 3/2015 | Badura | G02B 6/44775 |
| | | | 385/135 |
| 2015/0168664 A1* | 6/2015 | Coenegracht | G02B 6/4446 |
| | | | 385/135 |
| 2020/0249407 A1* | 8/2020 | Aznag | G02B 6/4446 |
| 2020/0319420 A1* | 10/2020 | Cams | G02B 6/4454 |
| 2023/0041299 A1* | 2/2023 | Frampton | G02B 6/4444 |

* cited by examiner

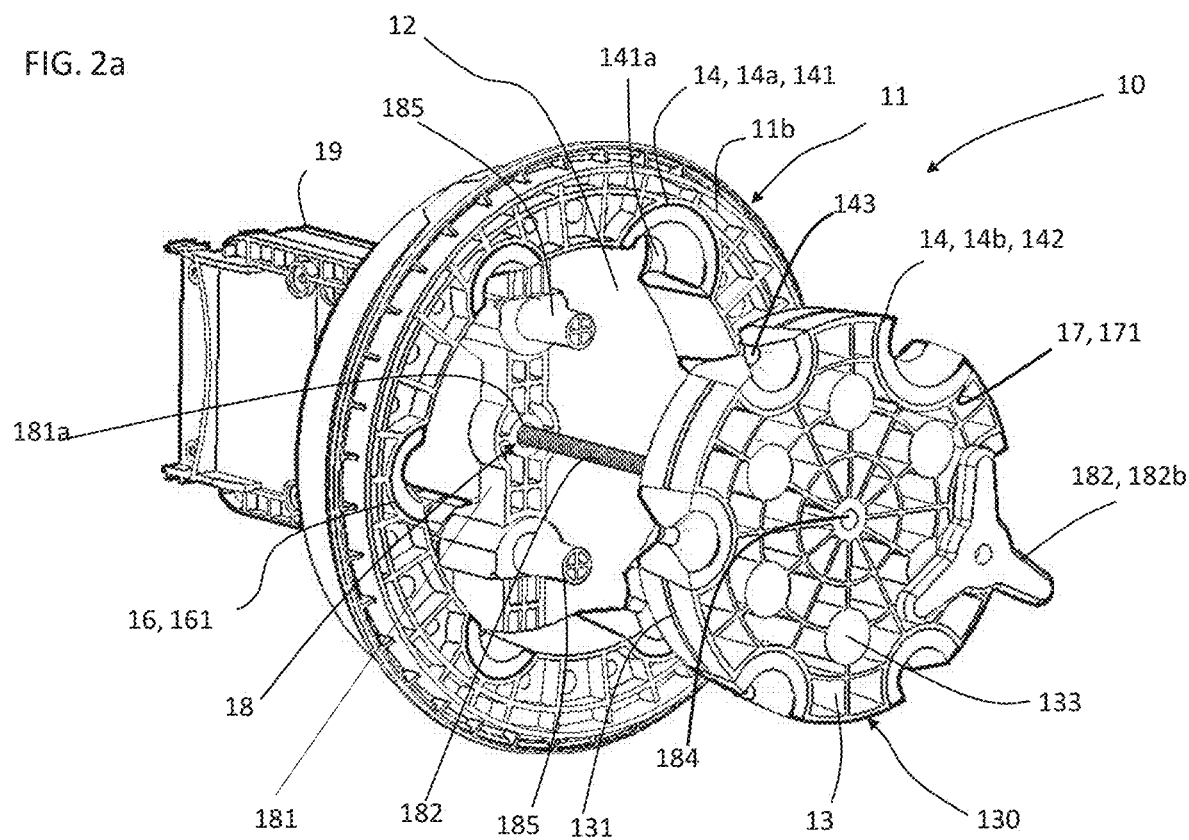

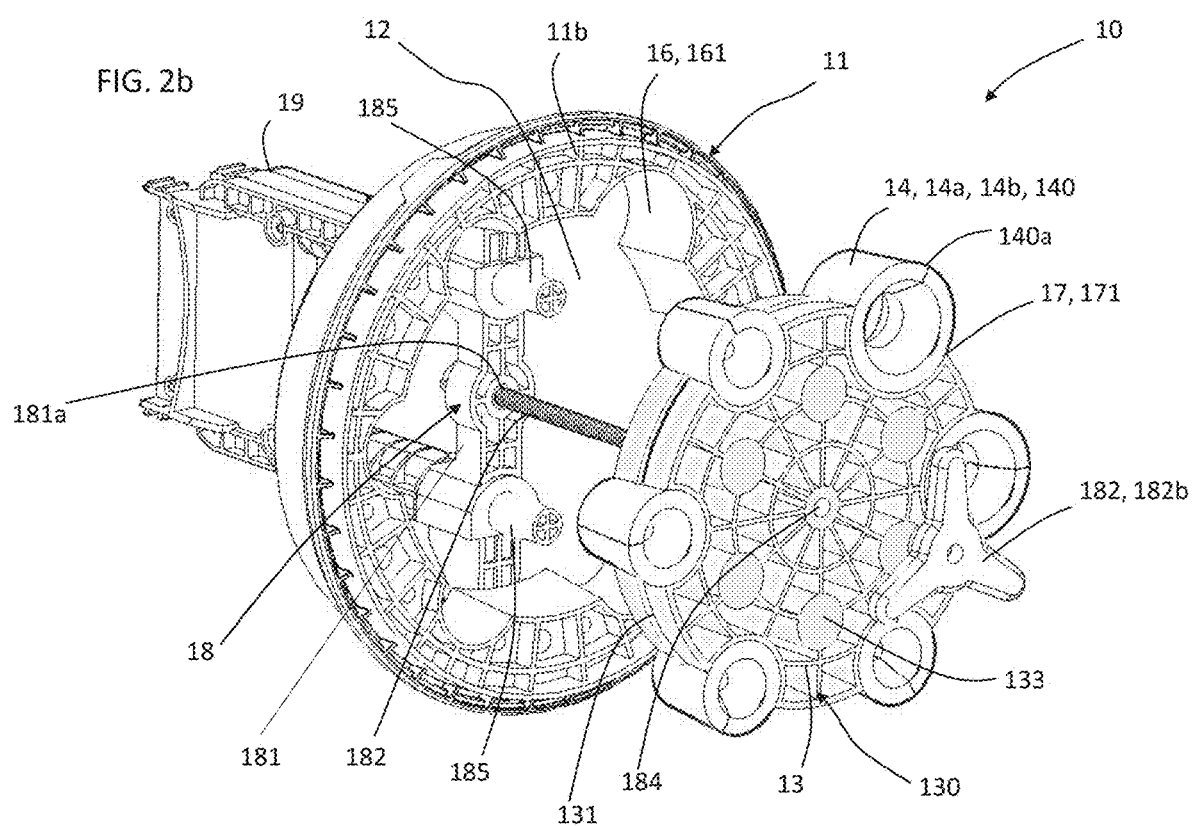

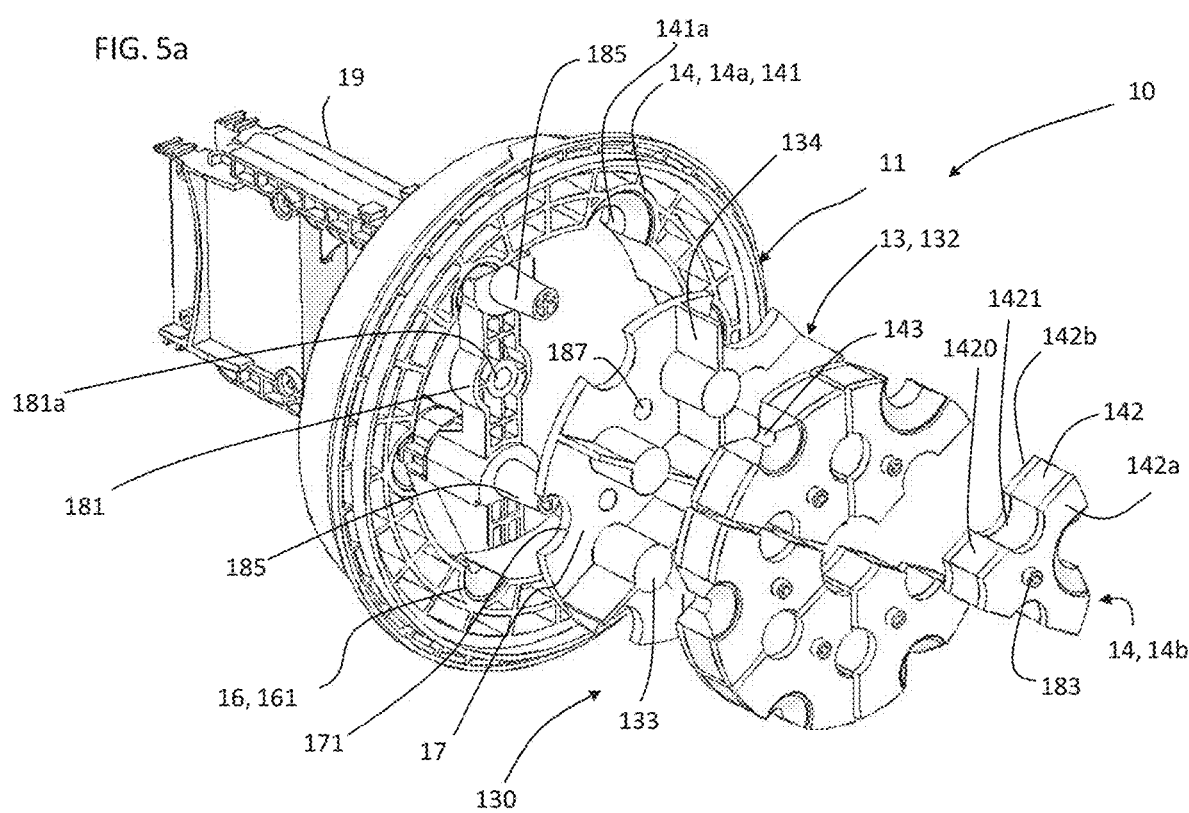

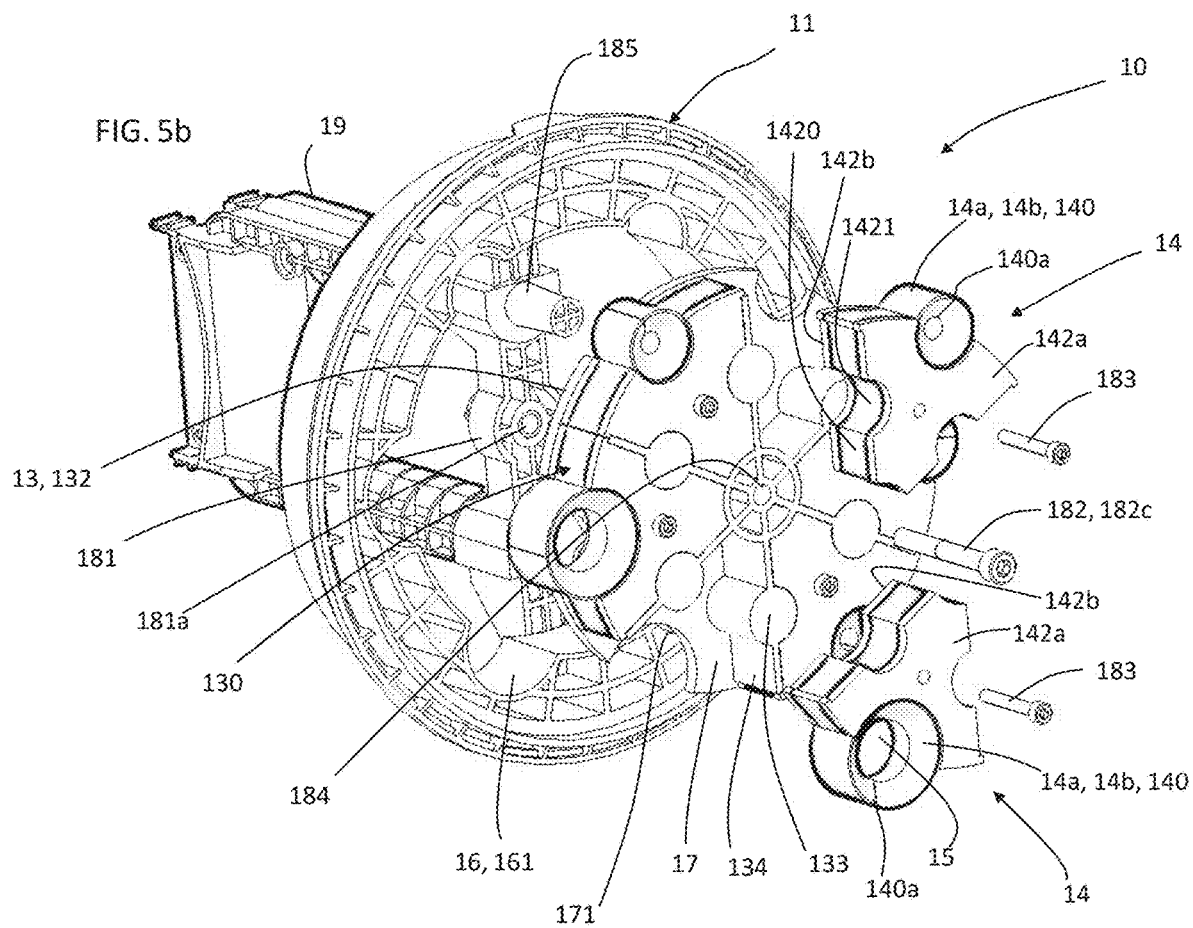

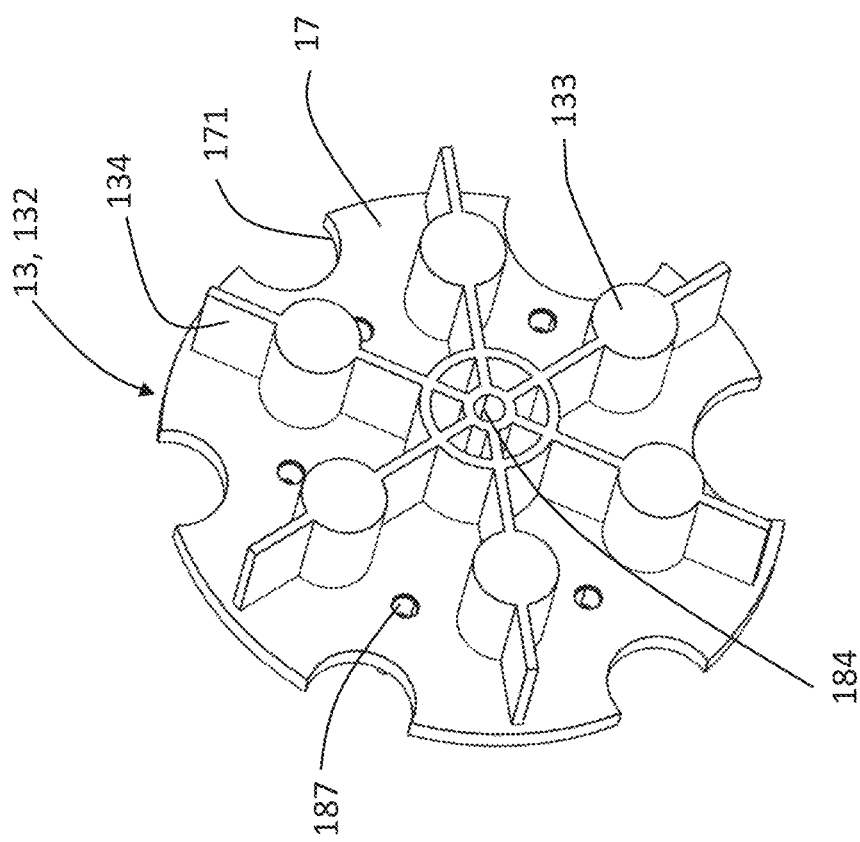

TELECOMMUNICATIONS ENCLOSURE

CROSS-REFERENCE TO RELATED APPLICATION

This application claims priority to Italian patent application number 102021000021113, filed Aug. 4, 2021, the entire disclosure of which is hereby incorporated herein by reference.

FIELD

The present disclosure relates to a telecommunications enclosure as well as to a method for coupling a cable to a cable port of the telecommunications enclosure.

BACKGROUND

Telecommunications systems typically employ a network of telecommunications cables capable of transmitting large volumes of data and voice signals over relatively long distances. The telecommunications cables can include fiber optic cables, electrical cables, or combinations of electrical and fiber optic cables. A typical telecommunications network also includes a plurality of telecommunications enclosures integrated throughout the network of telecommunications cables. The telecommunications enclosures are adapted to house and protect telecommunications components such as splices, termination panels, power splitters and wavelength division multiplexers.

Generally, a telecommunications enclosure comprises a plurality of splice trays for storing and splicing optical fibers together. Storage areas may be provided upstream the splice area to store extra-length portions of the optical fibers which are actually used as well as to store optical fibers which are not used. A telecommunications enclosure may further comprise routing elements, namely transportation tubes or routing channels, for suitably directing optical fibers, that may be grouped in fiber modules, which enter and exit the telecommunications enclosure, towards the splice trays and away from the splice trays.

Telecommunications enclosures are typically sealed to inhibit the intrusion of moisture or other contaminants. Pressurized gel-type seals have been used to effectively seal the locations where telecommunications cables enter and exit telecommunications enclosures.

U.S. Pat. No. 5,502,282 discloses a sleeve head for a cable sleeve having a single seal insert of elastic material with pressure-producing elements for compressing the seal insert. The seal insert is axially interposed between two pressure plates and comprises conically converging cable introduction openings. In an embodiment, the single seal insert is divided into a central part and an annular part.

U.S. Pat. No. 8,207,445 discloses a sealing body for a cable sleeve, comprising a central sealing body segment and a plurality of cylinder-segment-like sealing body segments that can be inserted into respective recesses made in the central sealing body segment in a radial direction thereof. A cable entry opening for sealing a cable is embodied in the area of each recess and of each cylinder-segment-like sealing body segment. Accordingly, a cable can be individually sealed in the corresponding cable entry opening. Each cylinder-segment-like sealing body segment has a gel-like sealing element between two opposite plates. A force can be exerted on one of the two plates by means of a pressure element in order to compress the gel-like sealing element. The gel-like sealing element is thus pressed against a cable laid in the corresponding cable entry opening in order to seal said cable in the area of the cable entry opening. Each gel-like sealing element of a cylinder-segment-like sealing body segment acts together with a gel-like sealing body element arranged in the respective recess of the central sealing body segment.

US 2020/0249407 discloses a telecommunications enclosure including a housing that comprise a dome that attaches to a base. A telecommunications assembly unit is housed within the housing. The telecommunications assembly unit includes a fiber optic manager coupled to a gel sealing unit. The gel sealing unit includes a gel sealing block that mounts within an actuator that is adapted to axially compress the gel sealing block to provide sealing. Sealing includes sealing of any cables routed through the cable ports defined by the gel sealing block. The gel sealing block includes a plurality of individual gel sealing modules. When the gel sealing modules are assembled together to form the gel sealing block, opposite sides of adjacent gel sealing modules seal relative to one another. The gel sealing modules are individually and separately removable from between inner and outer pressurization structures of the actuator. The gel sealing modules include cable sealing modules each defining at least one cable port. Each gel sealing module includes first and second gel portions that meet at a separable interface at which the respective cable port is defined. The first and second gel portions can be separated from one another when the cable sealing module is not mounted between the inner and outer pressurization structures to allow a cable to be laterally inserted into the cable port (i.e., the gel sealing modules can have a wrap-around design). Each gel sealing module also includes end caps between which an axis of the cable port extends. The end caps function to provide gel containment when the gel block is pressurized during sealing. The end caps include first end cap portions attached to opposite ends of the first gel portion and second end cap portions attached to opposite ends of the second gel portion. The first and second end cap portions are carried with their respective first and second gel portions when the gel portions are separated from one another. Thus, the first and second end cap portions separate from one another when the first and second gel portions are separated from one another.

The Applicant notes that in the solution disclosed by U.S. Pat. No. 8,207,445, when a cable has to be coupled to the sealing body, the appropriate cylinder-segment-like sealing body segment is moved away from the respective recess of the central sealing body segment, the cable is inserted into the recess in a radial direction, and the cylinder-segment-like sealing body segment is moved again towards the recess to enclose the cable into the respective cable entry opening.

In the solution disclosed by US 2020/0249407, when a cable has to be coupled to the gel sealing unit, the appropriate gel sealing module has to be removed from between inner and outer pressurization structures of the actuator. Then, the first and second gel portions of the gel sealing module have to be separated from each other to allow the cable to be laterally inserted into the respective cable port. After insertion of the cable into the cable port, the first and second gel portions of the gel sealing module can be moved again towards each other and the gel sealing module can be inserted again, as a whole, between the inner and outer pressurization structures of the actuator.

The Applicant notes that in both the above solutions the cylinder-segment-like sealing body segment, or gel sealing module respectively, has to be removed from the respective supporting structure radially outwards, thereby requiring a suitable operating space around the telecommunications enclosure.

This can complicate the coupling operation of a cable to a cable port especially when the telecommunications enclosure is situated in uncomfortable and cramped locations.

With reference to the solution disclosed by U.S. Pat. No. 5,502,282, the Applicant notes that cable openings are formed in a single seal insert of elastic material, optionally divided into a central part and an annular part. This means that when there is the need to replace a single cable opening, for example to change its size or to replace it due to damage, it is necessary to replace the whole seal insert. Furthermore, when not in use, it is not possible to replace a single cable opening with a closure cap. In addition, the Applicant notes that the solution of U.S. Pat. No. 5,502,282, wherein the whole seal insert is axially interposed between two pressure plates, requires a complex pressurization system to ensure that all cables are properly sealed and an extensive fixing system to make the structure as a whole robust. This makes the sleeve head rather complicated, easier to damage and more expensive.

The Applicant faced the technical problem of providing an alternative solution for a telecommunications enclosure.

In particular, the Applicant faced the technical problem of providing a telecommunications enclosure that enables to improve coupling of a cable to a cable port.

The Applicant also faced the technical problem of providing a telecommunications enclosure improved in terms of robustness, structural rigidity, ease of assembly, flexibility of use and easy of maintenance.

SUMMARY

The present disclosure thus relates to a telecommunications enclosure as well as to a method for coupling a cable to a cable port of a telecommunications enclosure.

In particular, in a first aspect, the present disclosure relates to a telecommunications enclosure comprising a casing, defining an inner cavity for housing a telecommunications module, and a base adapted to be removably coupled to the casing to close the casing, the base comprising:
  an outer structure having an inner opening;
  an inner assembly comprising an inner structure, adapted to be removably inserted within the inner opening of the outer structure, and a plurality of sealing modules, each comprising a first part and a second part;
wherein:
  the outer structure comprises a plurality of receiving portions each having a recess adapted to receive at least said first part of a respective sealing module of the plurality of sealing modules;
  the base is commutable between an assembled condition and a disassembled condition,
  in the assembled condition, the sealing modules, the inner structure and the outer structure are coupled to each other, the inner assembly is inserted within the inner opening of the outer structure and, for each sealing module, at least said first part is received in the respective recess, the second part is coupled to the inner structure, and said first part and second part define a corresponding cable port;
  in the disassembled condition, at least part of the inner assembly is removed from the inner opening of the outer structure to enable insertion of a cable into the respective cable port;

in both the assembled condition and disassembled condition, the plurality of receiving portions of the outer structure is connected to each other.

In a second aspect, the present disclosure relates to a method for coupling a cable to a cable port defined by a first part and a second part of a sealing module of a plurality of sealing modules of a base of a telecommunications enclosure, wherein the base comprises an outer structure, having an inner opening, and an inner assembly, which comprises said plurality of sealing modules and an inner structure adapted to be removably inserted within the inner opening of the outer structure, and wherein the outer structure comprises a plurality of receiving portions connected to each other and each having a recess adapted to receive at least the first part of a respective sealing module of the plurality of sealing modules, the method comprises:
  (i) removing at least part of the inner assembly from the inner opening of the outer structure;
  (ii) inserting the cable into the cable port defined by the sealing module;
  (iii) inserting again the at least part of the inner assembly within the inner opening of the outer structure;
  wherein (i), (ii) and (iii) are performed while the plurality of receiving portions of the outer structure remain connected to each other.

According to the present disclosure, at least part of the inner assembly of the base can be removed from the inner opening of the outer structure to enable insertion of a cable into the respective cable port, while the plurality of receiving portions of the outer structure remain connected to each other in both the assembled condition and disassembled condition of the base.

An operator is thus enabled to access the cable ports of the telecommunications enclosure by acting only on the inner assembly of the base. This may advantageously facilitate the coupling operation of a cable to a cable port especially when the telecommunications enclosure is situated in uncomfortable and cramped locations. For example, the operator is enabled to access the cable ports from inside the outer structure of the base, that is from the inner opening of the outer structure. A cable can therefore be inserted into the inner opening of the outer structure and then the cable can be displaced along a radially outer direction to access a relevant cable port.

In addition, according to the present disclosure, the cable ports are defined by a plurality of sealing modules. In this way, when there is the need to replace a single cable port, for example to change its size or to replace it due to damage, it is possible to replace only the relevant sealing module. Moreover, when a cable port is not used, it is possible to replace the relevant sealing module with a suitable sealing closure cap. Furthermore, according to the present disclosure, at least in the assembled condition, at least the first parts of the sealing modules are received in the respective recesses of the outer structure. This advantageously enables to improve cable sealing and to strengthen the structure of the telecommunications enclosure. In particular, this feature permits to avoid more complex pressurization system employed in other enclosure known in the art.

Accordingly, as a whole, the telecommunications enclosure according to the present disclosure enables to improve coupling of a cable to a cable port, and to provide robustness, structural rigidity, ease of assembly, flexibility of use and easy of maintenance.

In the present disclosure and claims, the term "elastically deformable element" is used to indicate an element made of a material which is susceptible to deformation caused by a relative small force and that is able to recover the substantially original shape and dimensions after the elimination of the deforming force. For the purpose of the present disclosure, an "elastically deformable element" is made of a material having an elastic modulus E (also known as Young's modulus) less than 0.5 GPa, preferably less than 0.1 GPa.

In the present disclosure and claims, the terms "axial" or "axially", in relation to components of a sealing g module, are used to indicate elements/magnitudes arranged/measured or extending in a direction substantially parallel to a main development axis of a length of a cable when inserted into a cable port.

In the present disclosure and claims, the terms "radial" and "radially", in relation to components of a sealing module, are used to indicate elements/magnitudes arranged/measured or extending in a direction that intersects a main development axis of a length of a cable when inserted into a cable port and that lies in a plane perpendicular to such an axis.

In the present disclosure and claims, the terms "axial" or "axially", in relation to a base and components thereof, are used to indicate elements/magnitudes arranged/measured or extending in a direction substantially parallel to a main development axis of the telecommunications enclosure.

In the present disclosure and claims, the terms "radial" and "radially", in relation to a base and components thereof, are used to indicate elements/magnitudes arranged/measured or extending in a direction that intersects a main development axis of the telecommunications enclosure and that lies in a plane perpendicular to such an axis.

In the present disclosure and claims, the terms "circumferential" and "circumferentially", in relation to a base and components thereof, are used to indicate elements/magnitudes arranged/measured or extending along a circumference developing around a main development axis of the telecommunications enclosure.

When a sealing module is coupled to a base of a telecommunications enclosure, an axial direction in relation to components of the sealing module is parallel to an axial direction in relation to the base and components thereof.

The present disclosure, in at least one of the aforementioned aspects, can be implemented according to one or more of the following embodiments, optionally combined together.

Suitably, the sealing modules are distinct from each other. In other words, they are made as distinct pieces.

Suitably, the inner structure is distinct from the sealing modules.

Suitably, the outer structure is distinct from the sealing modules.

In an embodiment, at least in the assembled condition, at least the first parts of the sealing modules are radially interposed between the inner structure and the outer structure.

In an embodiment, at least in the assembled condition, at least the first parts of the sealing modules are entirely radially interposed between the inner structure and the outer structure.

In an embodiment, each recess is adapted to receive at least said first part of the respective sealing module of the plurality of sealing modules in a radially inner position with respect to a radially inner surface of the recess.

In an embodiment, each recess is adapted to entirely receive at least said first part of the respective sealing module of the plurality of sealing modules in a radially inner position with respect to a radially inner surface of the recess.

In an embodiment, at least in the assembled condition, at least the first parts of the sealing modules are arranged in a radially inner position with respect to a radially inner surface of the respective recesses.

In an embodiment, at least in the assembled condition, at least the first parts of the sealing modules are entirely arranged in a radially inner position with respect to a radially inner surface of the respective recesses.

In an embodiment, in both the assembled condition and disassembled condition, the plurality of receiving portions of the outer structure are rigidly connected to each other.

In an embodiment, at least in the assembled condition, the plurality of receiving portions of the outer structure separates the first parts of the sealing modules from each other. In an embodiment, at least in the assembled condition, the first parts of the sealing modules are separated from each other by means of a rigid material making the outer structure.

In an embodiment, at least in the assembled condition, the plurality of receiving portions of the outer structure circumferentially separates the first parts of the sealing modules from each other. In an embodiment, at least in the assembled condition, the first parts of the sealing modules are circumferentially separated from each other by means of a rigid material making the outer structure.

In an embodiment, the inner structure is configured to be at least partially interposed between the second parts of the sealing modules at least in the assembled condition.

In an embodiment, the inner structure is configured to separate the second parts of the sealing modules from each other at least in the assembled condition. In an embodiment, at least in the assembled condition, the second parts of the sealing modules are separated from each other by means of a rigid material making the inner structure.

In an embodiment, the inner structure is configured to circumferentially separate the second parts of the sealing modules from each other at least in the assembled condition. In an embodiment, at least in the assembled condition, the second parts of the sealing modules are circumferentially separated from each other by means of a rigid material making the inner structure.

In an embodiment, at least one of the outer structures and the inner structure is configured to circumferentially separate the sealing modules from each other at least in the assembled condition. In an embodiment, at least in the assembled condition, the sealing modules are circumferentially separated from each other by means of a rigid material making at least one of the outer structure and the inner structure.

In an embodiment, at least in the assembled condition, the inner structure rigidly holds the second parts of the sealing modules.

In an embodiment, the inner structure is rigid.

In an embodiment, the inner structure is entirely made of a rigid material.

In an embodiment, the outer structure is rigid.

In an embodiment, the outer structure is entirely made of a rigid material.

In an embodiment, the outer structure is made as a single piece. In an embodiment, the plurality of receiving portions of the outer structure are rigid.

In an embodiment, the plurality of receiving portions of the outer structure are entirely made of a rigid material.

The rigid material can be for example injection molded, cast or machined engineered plastic (e.g. polypropylene or nylon).

In an embodiment, the inner structure is adapted to be axially inserted/removed within/from the inner opening of the outer structure.

In an embodiment, the receiving portions of the outer structure are circumferentially spaced apart of a same distance in both the assembled and disassembled condition of the base.

In an embodiment, the receiving portions of the outer structure are integral with the outer structure.

In an embodiment, the receiving portions of the outer structure are permanently coupled (that is, irremovably coupled) to each other in both the assembled and disassembled condition of the base.

In an embodiment, the base comprises coupling elements adapted to removably couple the inner structure to the outer structure.

Suitably, in the assembled condition of the base, the inner structure and the plurality of sealing modules are inserted within the inner opening of the outer structure.

In an embodiment, in the disassembled condition of the base, the inner structure and/or at least part of at least one sealing module is removed from the inner opening of the outer structure to enable insertion of a cable into the respective cable port.

In an embodiment, it is provided to remove the inner structure and/or at least part of at least one sealing module from the inner opening of the outer structure.

In an embodiment, it is provided to insert again the inner structure and/or at least part of at least one sealing module within the inner opening of the outer structure.

In an embodiment, said inner opening of the outer structure defines a through aperture in the base and said inner assembly is adapted to close said through aperture.

In an embodiment, in the disassembled condition of the base, said inner opening of the outer structure defines a through aperture in the base and in the assembled condition said inner assembly closes said through aperture.

In an embodiment, in the disassembled condition of the base, the second part of at least one sealing module is either:
 coupled to the outer structure and decoupled from the inner structure; or
 decoupled from the outer structure and coupled to the inner structure; or
 decoupled both from the outer structure and from the inner structure.

In an embodiment, in the disassembled condition of the base, the second part of each sealing module is either:
 coupled to the outer structure and decoupled from the inner structure; or
 decoupled from the outer structure and coupled to the inner structure; or
 decoupled both from the outer structure and from the inner structure.

In an embodiment, in the disassembled condition of the base, the first part of at least one sealing module is either:
 coupled to the outer structure and decoupled from the inner structure; or
 decoupled from the outer structure and coupled to the inner structure; or
 decoupled both from the outer structure and from the inner structure.

In an embodiment, in the disassembled condition of the base, the first part of each sealing module is either:
 coupled to the outer structure and decoupled from the inner structure; or
 decoupled from the outer structure and coupled to the inner structure; or
 decoupled both from the outer structure and from the inner structure.

In an embodiment, in the disassembled condition of the base, both the first part and the second part of at least one sealing module is either:
 coupled to the outer structure and decoupled from the inner structure; or
 decoupled from the outer structure and coupled to the inner structure; or
 decoupled both from the outer structure and from the inner structure.

In an embodiment, in the disassembled condition of the base, both the first part and the second part of each sealing module is either:
 coupled to the outer structure and decoupled from the inner structure; or
 decoupled from the outer structure and coupled to the inner structure; or
 decoupled both from the outer structure and from the inner structure.

In an embodiment, the first part of each sealing module is received in the respective recess of the plurality of receiving portions of the outer structure both in the assembled condition and in the disassembled condition.

In an embodiment, the first part of each sealing module is fixed (that is, irremovably coupled) to the respective recess of the plurality of receiving portions of the outer structure.

In a first variant, the first part and the second part of each sealing module are made as a single piece comprising a single elastically deformable element defining the respective cable port.

In an example of the first variant, each single elastically deformable element has access to allow the cable to enter the respective cable port. This advantageously enables radial insertion of the cable into the respective cable port.

In an example of the first variant, each single elastically deformable element has a through hole defining the respective cable port.

In an example of the first embodiment, the access of each single elastically deformable element is commutable between an open condition for entering of the cable into the respective cable port and a closed condition.

In an example of the first variant, the commutations of the access of each single elastically deformable element between the open condition and the closed condition and between the closed condition and the open condition are actuated through an elastic deformation of the access.

Each single elastically deformable element can be made of a gel-like material or an elastomeric material, such as for example, 20 shore silicon or 30 shore rubber.

In an example of the first variant, it is provided to insert the cable into the respective cable port through an elastic deformation of the respective access.

In a second variant, the first part and the second part of each sealing module are separable from each other.

In an example of the second variant, in the assembled condition of the base, the first part and the second part of each sealing module are coupled to each other to define the respective cable port.

In an example of the second variant, in the disassembled condition of the base, the first part and the second part of each sealing module are separated from each other. This advantageously enables radial insertion of the cable into the respective cable port.

In an example of the second variant, it is provided for separating the second part of the sealing module from the first part to radially insert the cable either in the first part or the second part of the sealing module.

The separation can be obtained as a result of removing the inner structure from the inner opening of the outer structure or by separating the second part of the sealing module from the first part after the removal of the inner structure from the inner opening.

In an example of the second variant, the first part of each sealing module comprises a first elastically deformable element.

In an example of the second variant, the second part of each sealing module comprises a second elastically deformable element.

In an example of the second variant, the first elastically deformable element and the second elastically deformable element of a sealing module are designed to match to each other so as to form an axial through hole when the base is in the assembled condition.

The first elastically deformable element and the second elastically deformable element can be made of a gel-like material or an elastomeric material, such as for example, 20 shore silicon or 30 shore rubber.

In an example of the second variant, the first elastically deformable element has a generally semi-cylindrical shape.

In an example of the second variant, the second elastically deformable element has a generally semi-cylindrical shape.

In an example of the second variant, the second elastically deformable element has a generally triangular-base prismatic shape.

In an embodiment, the second part of each sealing module is adapted to be connected to the inner structure.

In an embodiment, the inner structure comprises a plurality of supporting portions.

In an embodiment, in the assembled condition of the base, the second part of each sealing module is coupled to a respective supporting portion.

In an embodiment, the second part of each sealing module is fixed (that is, irremovably coupled) to the inner structure.

In an embodiment, the inner structure comprises a plurality of recesses formed in a peripheral region of the inner structure and defining said plurality of supporting portions.

In an embodiment, in the assembled condition of the base, the second part of each sealing module is received in a respective recess formed in the peripheral region of the inner structure.

In an embodiment, the second part of each sealing module is fixed (that is, irremovably coupled) to the respective recess formed in the peripheral region of the inner structure.

In an embodiment, the inner structure comprises a supporting frame defining said plurality of supporting portions each preventing the second part of a sealing module of said plurality of the sealing modules from axially moving with respect to the base at least in the assembled condition of the base.

In an embodiment, the second part of each sealing module is adapted to be removably coupled to the respective supporting portion of said plurality of supporting portions.

The supporting frame can be made as a single piece.

The supporting frame can be made of a rigid material. The rigid material can be, for example, injection molded, cast or machined engineered plastic (e.g. polypropylene or nylon).

In an embodiment, the second part of each sealing module is adapted to be individually and removably coupled to said supporting frame, in particular to the respective supporting portion of said plurality of supporting portions.

In an embodiment, each sealing module comprises a first rigid member, which is coupled to the second elastically deformable element or to at least part of the single elastically deformable element and is removably connectable to said supporting frame, in particular to the respective supporting portion of said plurality of supporting portions.

In an embodiment, each sealing module comprises a first rigid member and a second rigid member removably connectable to said supporting frame, in particular to the respective supporting portion of said plurality of supporting portions, the second elastically deformable element or at least part of the single elastically deformable element of the sealing module being axially interposed between the first rigid member and the second rigid member.

In an embodiment, each sealing module comprise a pressure element adapted to axially compress the second elastically deformable element or at least part of the single elastically deformable element between the first rigid member and the second rigid member.

In an embodiment, the pressure element axially compresses a respective second elastically deformable element or at least part of a respective single elastically deformable element when the base is in the assembled condition. This advantageously enables to improve the sealing of the cable in the respective cable port.

The pressure element can be used to removably connect the first rigid member and the second rigid member to said supporting frame, in particular to the respective supporting portion of said plurality of supporting portions.

The pressure element may include a screw tightener.

In an embodiment, each sealing module comprises a slider, coupled to the respective second part, and adapted to be slidingly inserted into the respective recess of the plurality of receiving portions of the outer structure. The slider can be made of a rigid material like, for example, injection molded, cast or machined engineered plastic (e.g. polypropylene or nylon).

The slider can be fixed (that is, irremovably coupled) or removably coupled to the respective second part.

In an embodiment, in the assembled condition of the base, each sealing module is inserted (together with the respective slider) into the respective recess of the plurality of receiving portions of the outer structure.

In an embodiment, in the disassembled condition of the base, at least the slider of at least one sealing module is removed from the respective recess of the plurality of receiving portions of the outer structure so as to enable insertion of a cable into the respective cable port.

The slider can be removed alone from the respective recess or together with the second part of the sealing module or together with the whole sealing module.

In an embodiment, the inner structure comprises a closure frame.

In an embodiment, the closure frame, in the assembled condition of the base, radially blocks the plurality of sealing modules within the respective recesses of the receiving portions of the outer structure.

The closure frame can comprise a first portion and a second portion.

In an embodiment, the first portion of the closure frame is counter-shaped to the inner opening of the outer structure, as defined once the sealing modules are inserted in the respective recesses of the outer structure.

In an embodiment, in an assembled condition of the base, the first portion of the closure frame radially blocks the plurality of sealing modules within the respective recesses of the receiving portions of the outer structure. This advantageously enables to prevent radial movements of the sealing modules with respect to the outer structure.

In an embodiment, the second portion of the closure frame is a collar that surrounds the first portion and develops radially away from the first portion.

In an embodiment, the second portion of the closure frame defines the above-mentioned plurality of supporting portions of the inner structure.

In an embodiment, the second portion of the closure frame axially blocks the sliders and the second parts of the plurality of sealing modules from moving along a direction away from the casing of the telecommunications enclosure.

In an embodiment, the plurality of supporting portions of the second portion of the closure frame comprises a corresponding plurality of recesses formed in a radially outer peripheral region of the second portion of the closure frame for allowing a cable to axially cross the closure frame.

In an embodiment, the second portion of the closure frame comprises coupling elements adapted to removably couple the inner structure to the outer structure.

In an embodiment, it is provided for coupling the first part and the second part of said at least one sealing module to wrap the cable into the respective cable port defined thereby.

This coupling can be obtained as a result of inserting the inner structure within the inner opening of the outer structure or by coupling the first part and the second part of said at least one sealing module before the insertion step.

BRIEF DESCRIPTION OF THE FIGURES

The features and advantages of the present disclosure will be made apparent by the following detailed description of some exemplary embodiments thereof, provided merely by way of non-limiting examples, description that will be conducted by making reference to the attached drawings, wherein:

FIG. 2a schematically shows an exploded view of a base of a telecommunications enclosure according to a first embodiment of the present disclosure, the base being in a disassembled condition.

FIG. 2b schematically shows an exploded view of a base of a telecommunications enclosure according to a variant of the first embodiment shown in FIG. 2a, the base being in a disassembled condition.

FIG. 4 schematically shows another view of the base of FIG. 3a.

FIG. 5a schematically shows an exploded view of a base of a telecommunications enclosure according to a second embodiment of the present disclosure, the base being in a disassembled condition.

FIG. 5b schematically shows an exploded view of a base of a telecommunications enclosure according to a variant of the second embodiment shown in FIG. 5a, the base being in a disassembled condition.

FIG. 6 schematically shows a supporting frame of an inner structure of the base of FIGS. 5a and 5b.

FIG. 1 shows a telecommunications enclosure 1 according to the present disclosure.

DETAILED DESCRIPTION

Figure 1:
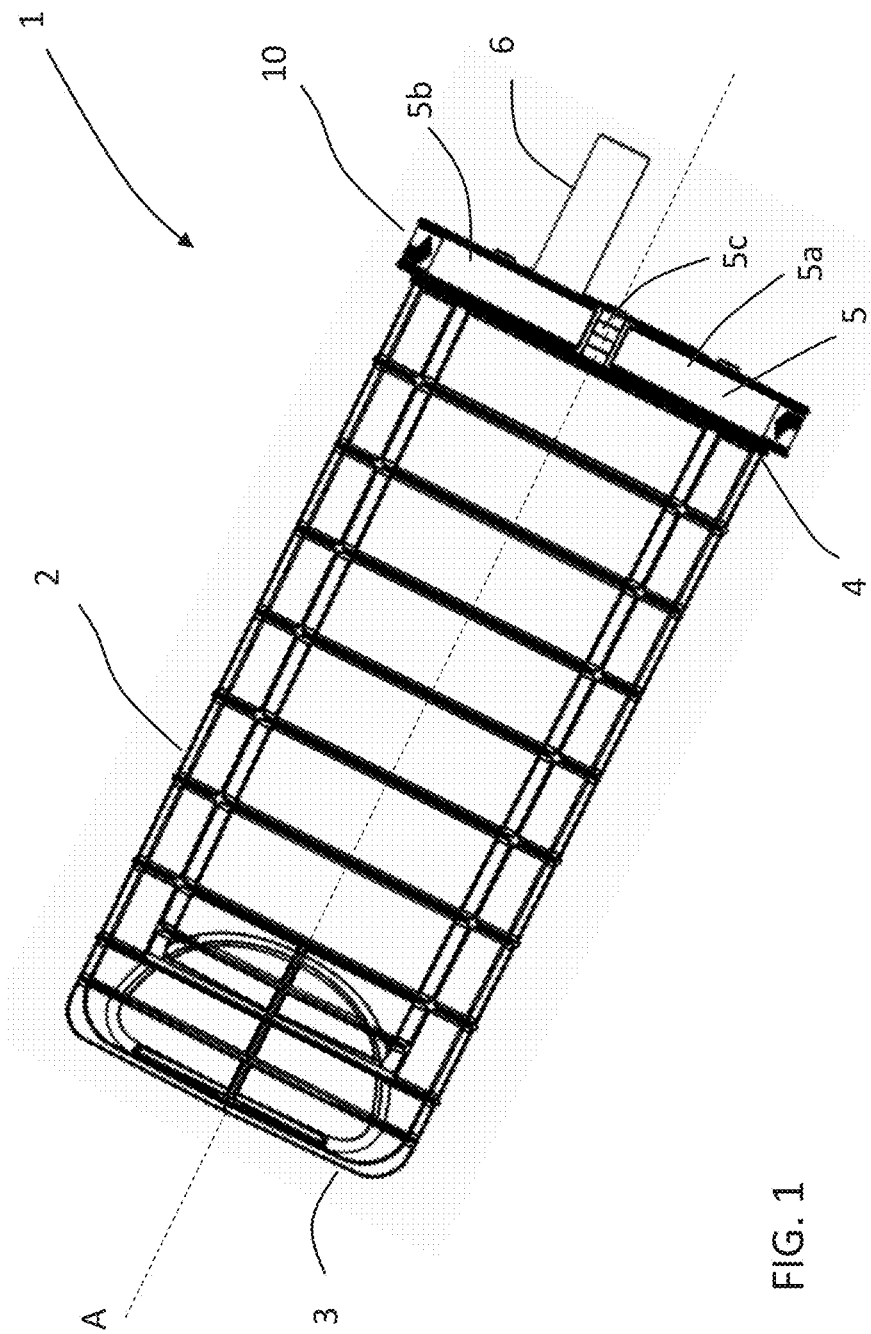
FIG. 1 schematically shows a telecommunications enclosure according to the present disclosure.

The telecommunications enclosure 1 comprises a casing 2, defining an inner cavity for housing a telecommunications module (not shown), and a base 10 adapted to be removably coupled to the casing 2 to close the casing 2.

The telecommunications module may comprise, for example, telecommunications components (not shown) such as splices, termination panels, power splitters and wavelength division multiplexers.

Generally, the telecommunications module comprises a plurality of splice trays for storing and splicing optical fibers of optical cables 6. Storage areas may be provided upstream the splice area to store extra-length portions of the optical fibers which are actually used as well as to store optical fibers which are not used. The telecommunications module may further comprise routing elements, namely transportation tubes or routing channels, for suitably directing optical fibers, which may be grouped in fiber modules, which enter and exit the telecommunications enclosure 1, towards the splice trays and away from the splice trays.

The casing 2 may have an elongated shape developing along a main development axis A.

The casing 2 may have a generally cylindrical hollow shape.

The casing 2 has a closed end 3 and an opposite open end 4 adapted to be closed by the base 10.

The closed end 3 of the casing 2 may be dome-shaped or may have generally rounded edges.

The base 10 may be generally cylindrical.

The base 10 comprise a plurality of cable ports (not visible in FIG. 1) for housing optical cables 6 (by way of example, only one optical cable 6 is shown in FIG. 1).

The base 10 may be coupled to the casing 2 by means of a circular clamp 5. The circular clamp 5 comprises a first semicircular sleeve 5a and a second semicircular sleeve 5b hinged to each other through a pin 5c. The first semicircular sleeve 5a and the second semicircular sleeve 5b have a respective free end at a position circumferentially opposite to the pin 5c. A closure (not shown) acts on said free ends between a close position wherein the free ends of the first semicircular sleeve 5a and of the second semicircular sleeve 5b are close to each other and an open position wherein the free ends of the first semicircular sleeve 5a and of the second semicircular sleeve 5*b* are spaced apart to each other. In the close position the circular clamp 5 clamps the base 10 and the casing 2 so as to firmly couple the base 10 and the casing 2. In the open position the clamp 5 does not clamp the base 10 and the casing 2 so allowing the base 10 to be separated from the casing 2.

Figure 3A:
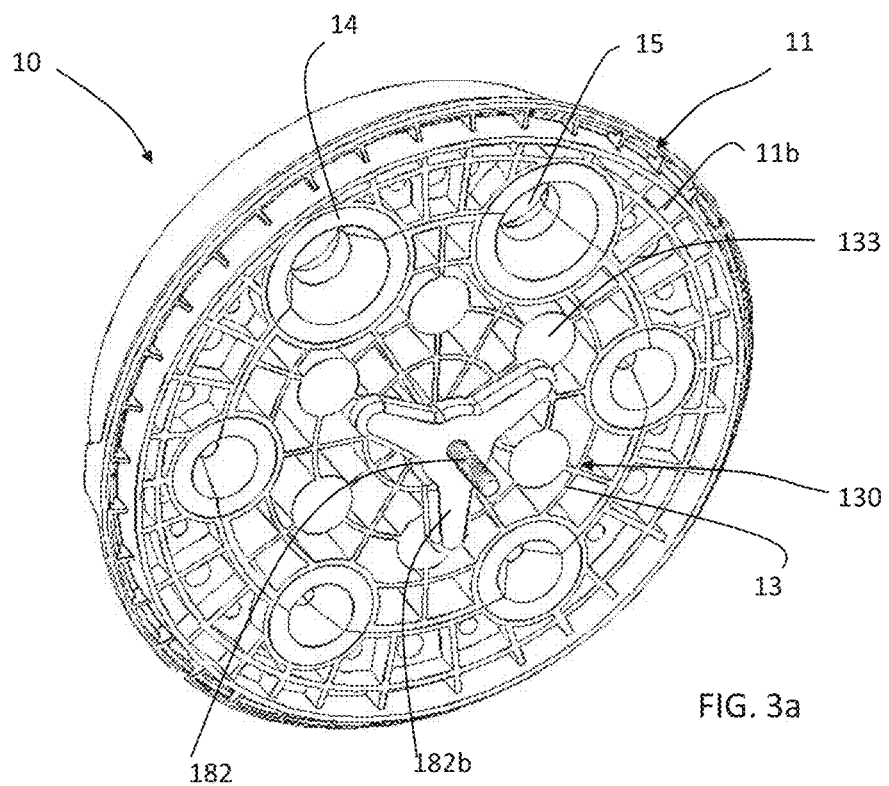
FIG. 3a schematically shows a view of the base of FIG. 2a in an assembled condition.
Figure 3B:
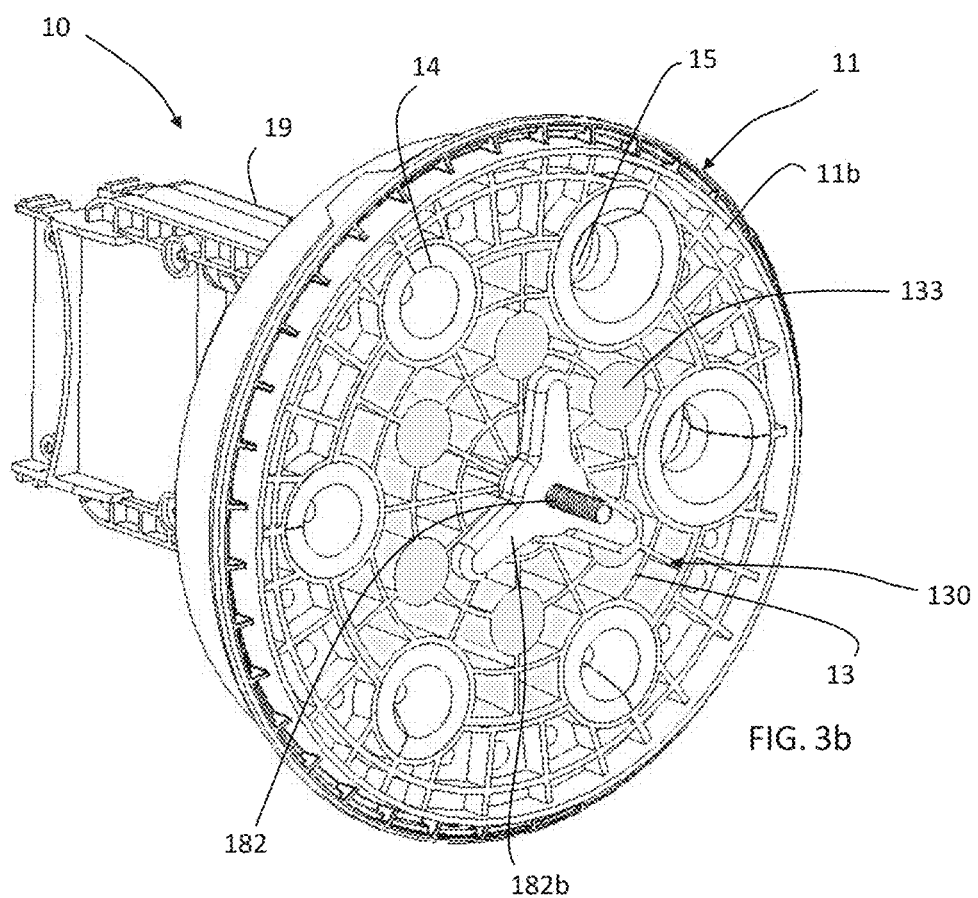
FIG. 3b schematically shows a view of the base of FIG. 2b in an assembled condition.
Figure 4:
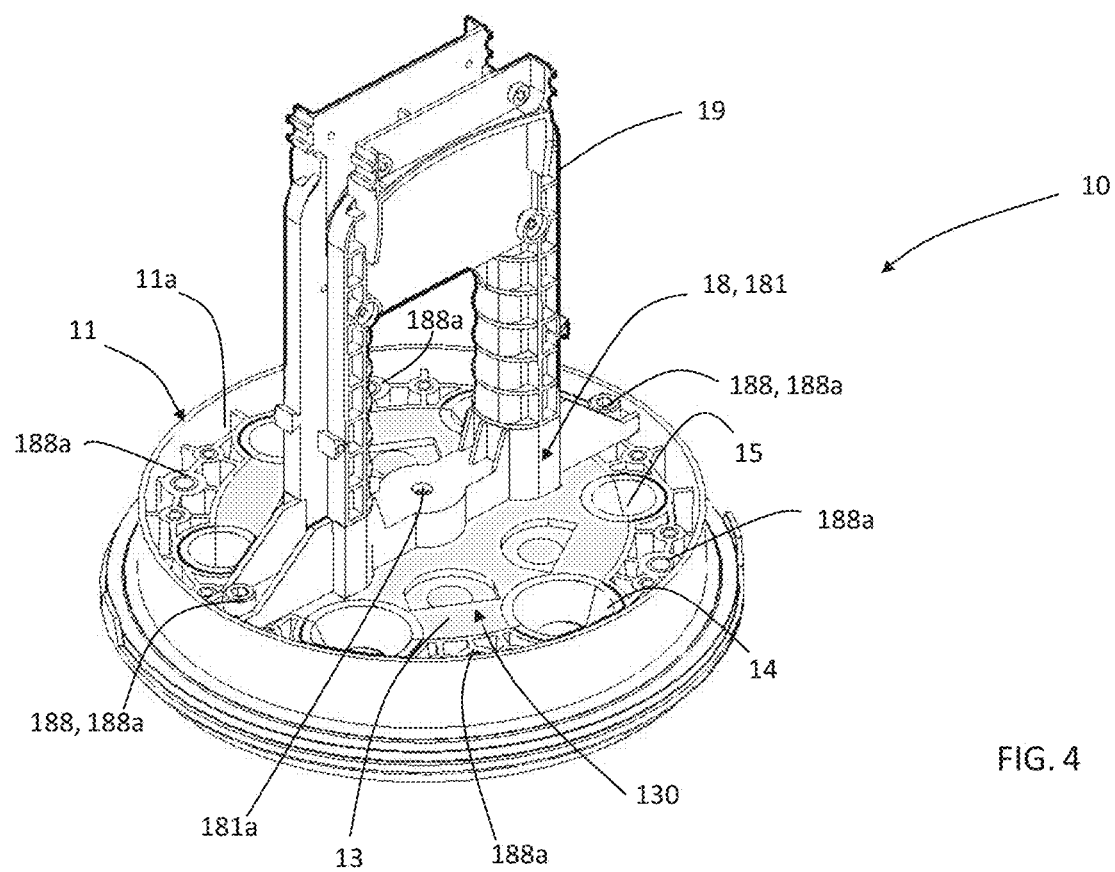

According to a first embodiment shown in FIGS. 2-4, the base 10 comprises an outer structure 11 and an inner assembly 130.

The outer structure 11 has an inner opening 12 defining a through aperture in the base 10.

The inner assembly 130 is adapted to be inserted within the inner opening 12 to close said through aperture.

The inner assembly 130 comprises an inner structure 13.

The inner structure 13 is adapted to be removably inserted within the inner opening 12 of the outer structure 11 to close said through aperture.

The inner structure 13 is designed to fit the inner opening 12. The inner structure 13 is counter-shaped to the inner opening 12.

The outer structure 11 is generally ring shaped.
The inner opening 12 is generally cylindrical.
The inner structure 13 is generally cylindrical.
The inner structure 13 and the outer structure 11 are made of a rigid material like for example injection molded, cast or machined engineered plastic (e.g. polypropylene or nylon).

The outer structure 11 is made as a single piece.

The inner structure 13 is coupled to the outer structure 11 by means of suitable coupling elements 18.

In the embodiment shown in FIGS. 2-4, the coupling elements 18 comprise, for example, a support bar 181. As shown in FIG. 4, the support bar 181 is fixed (e.g. by means of screws 188) to the outer structure 11 at a first side 11*a* of the outer structure 11, which is proximal with respect to the casing 2.

Moreover, when the inner structure 13 is inserted within the inner opening 12 of the outer structure 11, the support bar 181 is also fixed to the inner structure 13. As shown in FIGS. 2*a* and 2*b*, the support bar 181 is fixed to the inner structure 13 by means of a screwed bolt 182, passing through a central through hole 184 of the inner structure 13 and a central through hole 181*a* of the support bar 181, and a nut 182*b* at a second side 11*b* of the outer structure 11, axially opposite to the first side 11*a* of the outer structure 11 and distal with respect to the casing 2.

In the example shown in FIG. 4, the support bar 181 can be fixed to the outer structure 11 at different radial positions, depending on the needs. To this end, the outer structure 11 comprises couples (in the example, three couples) of engagement seats 188*a* adapted to engage with the support bar 181. The engagement seats 188*a* are defined at the first side 11*a* of the outer structure 11 and are equally spaced along a circumferential direction of the outer structure 13. The engagement seats 188*a* are designed to receive the screws 188 so as to couple the support bar 181 to the outer structure 11.

In the example, the support bar 181 comprises two pins 185 (see FIG. 2) and the inner structure 13 comprises couples (in the example, three couples) of engagement seats 133 that are defined in the inner structure 13 and are equally spaced along a circumferential direction of the inner structure 13. Depending on the desired orientation among said different radial positions, the pins 185 are adapted to be engaged with a selected couple of the engagement seats 133 so as facilitate alignment of the inner structure 13 in the desired orientation.

The support bar 181 is coupled to a connector 19 adapted to be coupled to the telecommunications module (not shown).

The inner assembly 130 comprises a plurality of sealing modules 14 defining a corresponding plurality of cable ports 15.

The cable ports 15 may have same or different size, depending on the needs.

In a first variant shown in FIGS. 2*a*, 3*a* and 4, each sealing module 14 is made as a first part 14*a* and a second part 14*b* separable from each other.

The first part 14*a* of each sealing module 14 comprises a first elastically deformable element 141.

The second part 14*b* of each sealing module 14 comprises a second elastically deformable element 142.

The first elastically deformable element 141 and the second elastically deformable element 142 have substantially identical shape and comprise a respective radially inner surface and radially outer surface. The radially inner surfaces have a semi-cylindrical shape or a double tapered shape and comprise a semi-circular indent 141*a*, 143 defining an axial aperture.

The radially outer surfaces have a semi-cylindrical shape or a double tapered shape.

The shape of the first elastically deformable element 141 and the second elastically deformable element 142 is, substantially, semi-cylindrical.

The semi-circular indent 143 of the second elastically deformable element 142 of each second part 14*b* matches with the semi-circular indent 141*a* of the first elastically deformable element 141 of the respective first part 14*a* so as to define a through hole for the respective cable port 15.

The first elastically deformable element 141 and the second elastically deformable element 142 can be made of a gel-like material or an elastomeric material, such as for example, such as for example 20 shore silicon or 30 shore rubber.

The first elastically deformable element 141 and the second elastically deformable element 142 are adapted to seal a cable into the relevant cable port 15 by surrounding and contacting the cable and by exerting a radially compressing force on the cable 6. This advantageously enables to inhibit the intrusion of moisture or other contaminants at the cable ports 15 where the cables 6 enter and exit the telecommunications enclosure 1. Such a radially compressing force exerted by the first elastically deformable element 141 and the second elastically deformable element 142 can be achieved by providing the semi-circular indents 141*a*, 143 with dimension that define a through hole with a diameter less than the diameter of the cable.

In a second variant shown in FIGS. 2*b* and 3*b*, which may be advantageous in terms of mechanical strength of the cable port 15, the first part 14*a* and the second part 14*b* of each sealing module 14 are made as a single piece (that is, the first part 14*a* and the second part 14*b* are not separable from each other), and the first elastically deformable element 141 and the second elastically deformable element 142 are replaced by a single elastically deformable element 140. In this second variant, the single elastically deformable element 140 has a through hole defining the respective cable port 15 and an access 140*a* (e.g. an axial slit). The access 140*a* axially opens the whole length of the single elastically deformable element 140 to enable a cable (not shown in FIGS. 2*b* and 3*b*) to radially enter the cable port 15. The through hole has a generally cylindrical shape or a double tapered shape. Apart from these differences, the first part 14*a* and the second part 14*b* of each sealing module 14 have the same structural and functional features as described above with reference to the variant of FIGS. 2a, 3a and 4.

In both variants of FIGS. 2-4, the outer structure 11 comprises a plurality of receiving portions 16 each having a recess 161 facing the inner opening 12 and adapted to receive the first part 14a of a respective sealing module 14. In both variants of FIGS. 2-4, the first part 14a of each sealing module 14 is adapted to be coupled to the respective recess 161 of the outer structure 11.

In the variant of FIGS. 2a, 3a and 4, the first part 14a of each sealing module 14 is retained in the respective recess 161 of the outer structure 11. The first part 14a of each sealing module 14 may be coupled to the respective recess 161 of the outer structure 11 by anchoring the radially outer surface of the first elastically deformable element 141 to the recess 161.

In both variants of FIGS. 2-4, the inner structure 13 comprises a plurality of supporting portions 17 each defined by a respective recess 171 formed in a peripheral circular region of the inner structure 13. Each recess 171 is adapted to receive the second part 14b of a respective sealing module 14. In both variants of FIGS. 2-4, the second part 14b of each sealing module 14 is adapted to be coupled to the respective recess 171 of the inner structure 13.

In both variants of FIGS. 2-4, the second part 14b of each sealing module 14 is retained in the respective recess 171 of the inner structure 13. In particular, in the variant of FIGS. 2b and 3b, the single elastically deformable element 140 of each sealing module 14 is retained in the respective recess 171 of the inner structure 13 at the second part 14b of the sealing module 14. The second part 14b of each sealing module 14 may be coupled to the respective recess 171 of the inner structure 13 by anchoring the radially outer surface of the second elastically deformable element 142 to the recess 171.

In an alternative example (not shown) of the second variant of FIGS. 2b and 3b, wherein the first part 14a and the second part 14b of each sealing module 14 are made as a single piece, the single elastically deformable element 140 may be retained in the respective recess 161 of the outer structure 11 at the first part 14a of the sealing module 14 (instead of in the respective recess 171 of the inner structure 13 at the second part 14b of the sealing module 14, as in the variant of FIGS. 2b and 3b).

The inner structure 13 may comprise sealing segments 131 (see FIGS. 2a and 2b) extending circumferentially along the peripheral circular region of the inner structure 13, between one recess 171 and another, and configured to act against the outer structure 11 to seal the inner structure 13 to the outer structure 11.

The base 10 is commutable between an assembled condition (shown in FIGS. 3a, 3b and 4) and a disassembled condition (shown in FIGS. 2a and 2b).

In the variant shown in FIGS. 2a, 3a and 4, in both the assembled condition and disassembled condition, the first part 14a of each sealing module 14 is retained in the respective recess 161 of the outer structure 11 and the second part 14b of each sealing module 14 is retained in the respective recess 171 of the inner structure 13.

In the assembled condition, the sealing modules 14, the inner structure 13 and the outer structure 11 are coupled to each other. The inner structure 13 is inserted within the inner opening 12 of the outer structure 11.

In the assembled condition, for each sealing module 14, the semi-circular indent 143 of the second elastically deformable element 142 matches with the semi-circular indent 141a of the first elastically deformable element 141 so as to define the respective cable port 15.

In the disassembled condition, the inner structure 13 is removed from the inner opening 12 of the outer structure 11 together with the second parts 14b of the sealing modules 14 that remain anchored to the respective recesses 171. On the other side, the first parts 14a of the sealing modules 14 remain anchored to the respective recesses 161 of the outer structure 11. In this way, the first part 14a and the second part 14b of each sealing module 14 are separated from each other to enable radial insertion of a cable into the respective cable port 15.

In both the assembled condition and disassembled condition, the plurality of receiving portions 16 of the outer structure 11 are connected to each other.

In other words, the commutations of the base 10 between the assembled condition and the disassembled condition, and viceversa, does not affect the shape and the configuration of the outer structure 11. The outer structure 11 presents the same shape and configuration in both the assembled condition and disassembled condition of the base 10. In such a configuration the receiving portions 16 of the outer structure 11 are connected to each other, the distance between any two receiving portions 16 and/or the mutual orientation between any two receiving portions 16 remain the same.

In the second variant shown in FIGS. 2b and 3b, wherein the first part 14a and the second part 14b of each sealing module 14 are made as a single piece, in the assembled condition of the base 10, the first part 14a of each sealing module 14 is coupled to the respective recess 161 of the outer structure 11 and the second part 14b of each sealing module 14 is coupled to the respective recess 171 of the inner structure 13. In particular, the above mentioned single elastically deformable element 140 has a radially outer surface which is in contact with the respective recess 161 of the outer structure 11 at the first part 14a of the sealing module 14 and with the respective recess 171 of the inner structure 13 at the second part 14b of the sealing module 14. On the other side, in the disassembled condition of the base 10, the single elastically deformable element 140 is retained in the respective recess 171 of the inner structure 13. In an alternative example (not shown), the single elastically deformable element 140 may be retained in the respective recess 161 of the outer structure 11. In any case, a cable is enabled to radially enter the appropriate cable port 15 through the respective access 140a. Moreover, in both the assembled condition and disassembled condition, the plurality of receiving portions 16 of the outer structure 11 are connected to each other.

Accordingly, in this first embodiment, in the disassembled condition of the base 10, of the inner assembly 130:

the inner structure 12 with the second parts 14b of the sealing modules 14 is removed from the inner opening 12 (FIG. 2a);

the inner structure 12 with the sealing modules 14 as a whole is removed from the inner opening 12 (FIG. 2b); or the inner structure 12 alone is removed from the inner opening 12 (alternative of the second variant not shown).

When a cable (not shown in FIGS. 2-4) has to be coupled to a cable port 15, the operator first decouples the inner structure 13 from the outer structure 11. This operation is actuated by unscrewing the nut 182b from the bolt 182. Then the inner structure 13 can be separated from the outer structure 11 by axially displacing the inner structure 13 from the inner opening 12 of the outer structure 11. At this point, in the first variant of FIGS. 2a, 3a and 4, the cable can be axially inserted into the inner opening 12 and then radially inserted either in the first part 14a or in the second part 14b of the appropriate sealing module 14. In the second variant of FIGS. 2b and 3b, wherein the first part 14a and the second part 14b of each sealing module 14 are made as a single piece, the cable can be radially inserted into the respective cable port 15 through the access 140a present in the respective single elastically deformable element 140. Then, the inner structure 13 can be axially inserted again into the inner opening 12 by engaging the pins 185 with the proper couple of engagement seats 133. Thereafter, after a proper axial positioning of the cable within the respective cable port 15, the inner structure 13 can be coupled again to the outer structure 11 by means of the bolt 182.

When the base 10 is in assembled condition and the cable ports 15 are not used, they may be closed by suitable closure caps (not shown in FIGS. 2-4) inserted into the through holes defining the cable ports 15.

FIGS. 5-7 show the base 10 according to a second embodiment of the present disclosure.

The base 10 according to this second embodiment comprises the same structural and functional features of the first embodiment of FIG. 2-4 (for which reference is made to what is described above) except as described below. Same reference numbers refer to the same or similar elements of the first embodiment of FIG. 2-4.

This second embodiment mainly differs from the first embodiment for the structural and functional features of the inner structure 13 and of the second parts 14b of the sealing modules 14. The outer structure 11 and the first parts 14a of the sealing modules 14 are substantially the same as in the first embodiment.

In this second embodiment, the inner structure 13 is defined by a generally disc shaped supporting frame 132 defining said plurality of supporting portions 17, each having a respective recess 171 formed in a peripheral circular region of the inner structure 13.

In the embodiment shown in FIGS. 5-7, the supporting frame 132 is made as a single piece of rigid material. The rigid material can be, for example, injection molded, cast or machined engineered plastic (e.g. polypropylene or nylon). The supporting frame 132 comprises a plurality of radial walls 134 projecting in an axial direction away from the casing 2. Each supporting portion 17 is formed between two circumferentially consecutive radial walls 134. In the example, each supporting portion 17 has a generally triangular shape with the recess 171 formed at the base of the triangular shape, the vertex of the triangular shape being substantially at the center of the supporting frame 132.

The support bar 181 is fixed to the supporting frame 132 by means of a bolt 182 passing through a central through hole 184 of the supporting frame 132, screwable into a hole 181a of the support bar 181 and having a head 182c abutting against a surface of the supporting frame 132 (visible in FIGS. 5b, 7a and 7b) placed at the central through hole 184. Alternatively, similarly to the first embodiment of FIGS. 2-4, the support bar 181 is fixed to the supporting frame 132 by means of a bolt, projecting from the support bar 181 and passing through a central through hole 184 of the supporting frame 132 and a hole 181a of the support bar 181, and a nut at the central through hole 184.

Similarly to the first embodiment of FIGS. 2-4, the support bar 181 can be fixed to the outer structure 11 at different radial positions, depending on the needs.

To this purpose, the support bar 181 comprises two pins 185 and the supporting frame 132 comprises couples (in the example, three couples) of engagement seats 133 that are defined in the supporting frame 132 at the radial walls 134 and are equally spaced along a circumferential direction of the supporting frame 132. Depending on the desired orientation among said different radial positions, the pins 185 are adapted to be engaged with a selected couple of the engagement seats 133 so as facilitate alignment of the supporting frame 132 in the desired orientation.

Figure 7A:
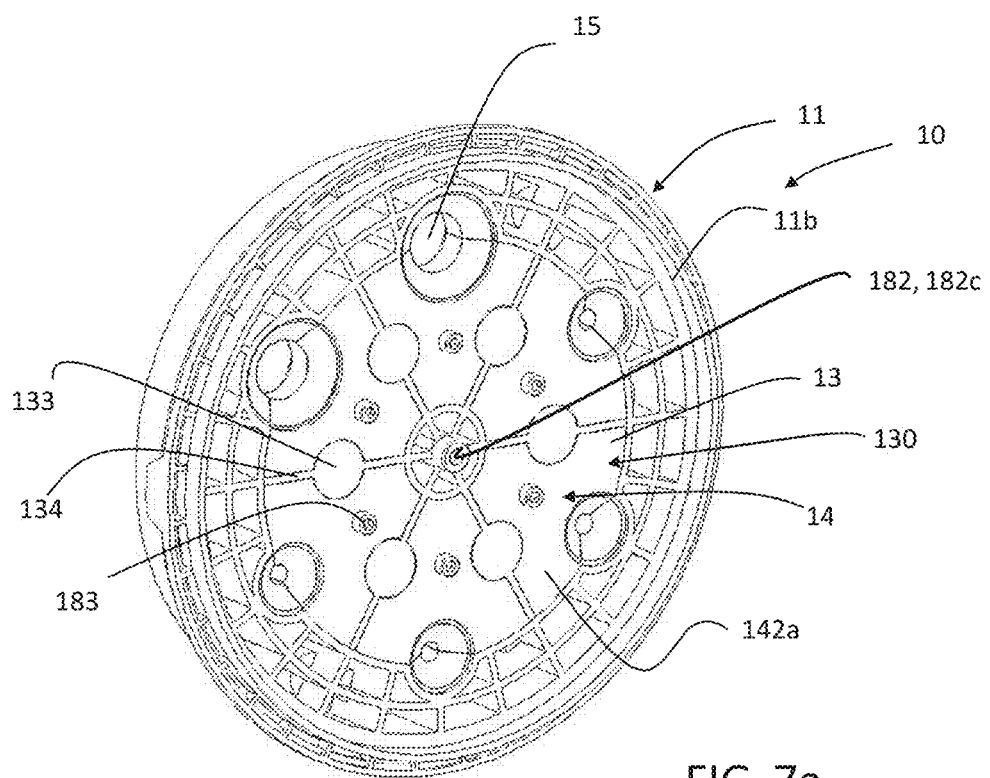
FIG. 7a schematically shows a view of the base of FIG. 5a in an assembled condition.

In the variant shown in FIGS. 5a and 7a, the first elastically deformable element 141 and the second elastically deformable element 142 have different shape. Both the first elastically deformable element 141 and the second elastically deformable element 142 comprise a respective radially inner surface and radially outer surface. The radially inner surfaces of the first elastically deformable element 141 and the second elastically deformable element 142 have the same shape, in particular a semi-cylindrical shape or a double tapered shape and comprise a semi-circular indent 141a, 143 defining an axial aperture.

The radially outer surfaces of the first elastically deformable elements 141 have a semi-cylindrical shape or a double tapered shape.

The radially outer surfaces of the second elastically deformable elements 142 comprise respective walls 1420 converging toward a central region wherein each wall 1420 is provided with a semi-circular indent 1421. The semi-circular indent 1421 is configured to partially surround a corresponding engagement seats 133.

The shape of the second elastically deformable element 142 is, substantially, a triangular based prism.

The shape of the first elastically deformable element 141 is, substantially, semi-cylindrical (as in the first embodiment).

The semi-circular indent 143 of the second elastically deformable element 142 of each second part 14b matches with the semi-circular indent 141a of the first elastically deformable element 141 of the respective first part 14a so as to define a through hole for the respective cable port 15.

In the variant shown in FIGS. 5a and 7a, the second elastically deformable element 142 of the second part 14b of each sealing module 14 is axially interposed between a first rigid member 142a and a second rigid member 142b of the sealing module 14.

The first rigid member 142a and a second rigid member 142b have the same shape and are countershaped to the shape of the second part 14b of the sealing module 14. In the illustrated embodiment, the first rigid member 142a and a second rigid member 142b have a substantially triangular shape.

The second part 14b of each sealing module 14 is individually and removably connectable to the supporting frame 132, in particular to the respective supporting portion 17. Each supporting portion 17 prevents the second part 14b of each sealing module 14 from axially moving with respect to the base 10 along a direction toward the casing 2 of the telecommunications enclosure 1. The coupling between each supporting portion 17 and the second part 14b of the respective sealing module 14 can be performed by means of suitable bolts 183 that pass through the first rigid members 142a, the second elastically deformable elements 142 and the second rigid members 142b, and engage with corresponding screwed holes 187 defined in the supporting frame 132.

The bolts 183 advantageously act as pressure elements that axially compress the second elastically deformable elements 142 of the second parts 14b of the sealing module 14 between the respective first rigid members 142a and second rigid members 142b. In this way the second elastically deformable elements 142 radially expand and press against the cables 6 inserted in the respective cable ports 15 so as to perform a sealing function.

Similarly to the first embodiment, in the assembled condition of the base 10, the first part 14a and the second part 14b of each sealing module 14 are coupled to each other to define the respective cable port 15, while in the disassembled condition of the base 10, the first part 14a and the second part 14b of each sealing module 14 are separated from each other to enable radial insertion of the cable into the respective cable port 15.

In particular, the first part 14a of each sealing module 14 is received in the respective recess 161 of the plurality of receiving portions 16 of the outer structure 11 both in the assembled condition and in the disassembled condition of the base 10.

The second part 14b of each sealing module 14 is coupled to the inner structure 13 and to the outer structure 11 in the assembled condition while in the disassembled condition it is decoupled from the outer structure.

Differently from the first embodiment, in the disassembled condition of the base 10 the second parts 14b of the sealing modules 14 can be decoupled from the inner structure 13.

The first elastically deformable element 141 and the second elastically deformable element 142 are adapted to seal a cable (not shown in FIGS. 5-7) into the relevant cable port 15 by surrounding and contacting the cable and by exerting a radially compressing force on the cable. This advantageously enables to inhibit the intrusion of moisture or other contaminants at the cable ports 15 where the cables enter and exit the telecommunications enclosure 1. Such a radially compressing force exerted by the first elastically deformable element 141 and the second elastically deformable element 142 can be achieved, alternatively or in combination, by providing the semi-circular indents 141a, 143 with dimension that define a through hole with a diameter less than the diameter of the cable, or by axially deforming the second elastically deformable element 142 so as to cause a radially expansion of the same and thus a compressing force against the cable. The axial deformation of the second elastically deformable element 142 can be performed by approaching first rigid members 142a and second rigid members 142b to each other, for example by screwing the bolts 183.

Figure 7B:
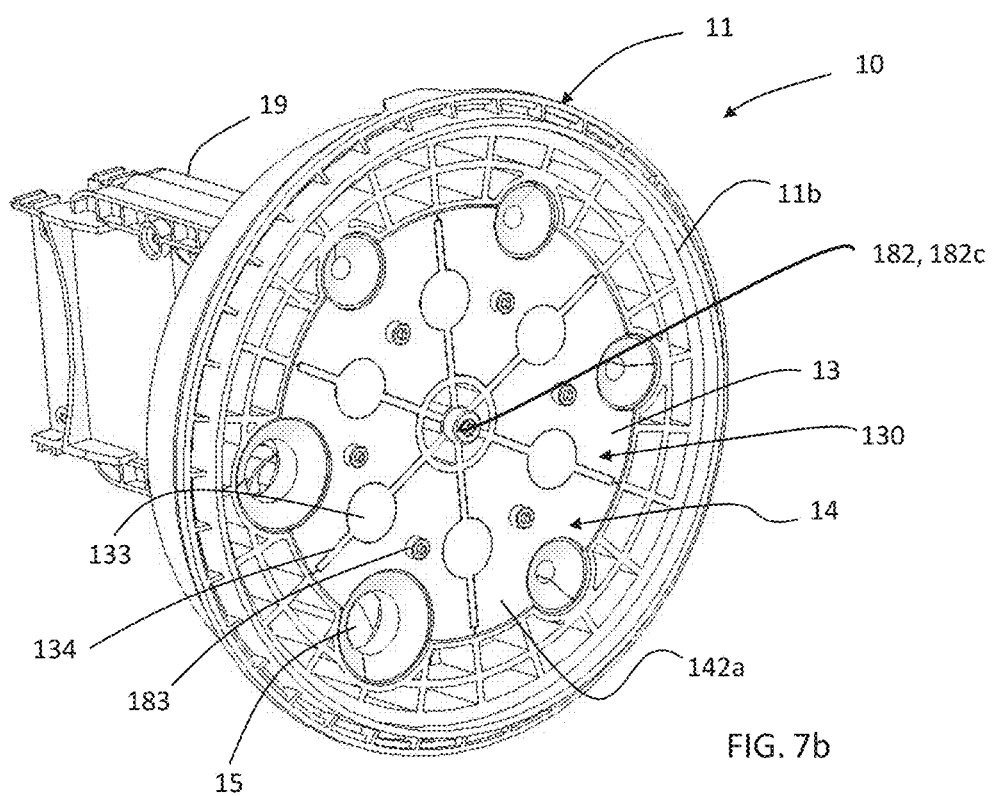
FIG. 7b schematically shows a view of the base of FIG. 5b in an assembled condition.

In a second variant shown in FIGS. 5b and 7b, which may advantageous in terms of mechanical strength of the cable port 15, the first part 14a and the second part 14b of each sealing module 14 are made as a single piece (that is, the first part 14a and the second part 14b are not separable from each other), and the first elastically deformable element 141 and the second elastically deformable element 142 are replaced by a single elastically deformable element 140. In this example, the single elastically deformable element 140 has a through hole defining the respective cable port 15 and an access 140a (e.g. an axial slit). The access 140a axially opens the whole length of the single elastically deformable element 140 to enable a cable to radially enter the cable port 15. The through hole has a generally cylindrical shape or double tapered shape. Moreover, as visible in FIG. 5b, the single elastically deformable element 140 has an overall shape resulting from a generally triangular based prism from which a semi-cylinder protrudes. The through hole is placed between the generally triangular based prism and the semi-cylinder. Apart from these differences, the first part 14a and the second part 14b of each sealing module 14 have the same structural and functional features as described above with reference to the variant shown in FIGS. 5a and 7a.

In this second variant of FIGS. 5b and 7b, in the assembled condition of the base 10, the single elastically deformable elements 140 of the sealing modules 14 are coupled to the outer structure 11 and to the inner structure 13. In particular, the first parts 14a of the sealing modules 14 are received in the respective recesses 161 of the plurality of receiving portions 16 of the outer structure 11 and the second parts 14b of the sealing modules 14 are coupled to the inner structure 13 (and, in particular, to the supporting frame 132) and to the outer structure 11. On the other side, in the disassembled condition of the base 10, individual sealing modules 14 can be decoupled from the respective supporting portions 17 of the supporting frame 132.

FIG. 5b shows an example of disassembled condition of the base 10 wherein the inner structure 13 is removed from the inner opening 12 of the outer structure 11 and two sealing modules 14 are decoupled from the respective supporting portion 17 of the supporting frame 132.

In the second embodiment of FIG. 5-7, when a cable (not shown in FIG. 5-7) has to be coupled to a cable port 15, the operator can first decouple the inner structure 13 (in particular, the supporting frame 132) from the outer structure 11 by acting on the coupling elements 18 and, in particular, on the above mentioned bolt 182. Then the inner structure 13 (together with the second parts 14b of the sealing modules 14 or the sealing modules 14 as a whole coupled thereto) can be axially removed from the inner opening 12 of the outer structure 11. At this point, in the variant of FIGS. 5a and 7a, the cable can be radially inserted either in the first part 14a or in the second part 14b of the appropriate sealing module 14. On the other side, in the second variant of FIGS. 5b and 7b, the cable can be radially inserted into the respective cable port 15 through the access 140a present in the respective single elastically deformable element 140.

In any case, the inner structure 13 (together with the second parts 14b or the sealing modules 14 as a whole coupled thereto) is then axially inserted again within the inner opening 12 by engaging the pins 185 with the proper couple of engagement seats 133.

Thereafter, after a proper axial positioning of the cable within the respective cable port 15, the inner structure 13 can be fixed again to the outer structure 11 by means of the bolt 182.

Optionally, especially in the second variant of FIGS. 5b and 7b, the appropriate sealing module 14 can be individually decoupled from the respective supporting portion 17 of the supporting frame 132 by acting on the bolt 183 and the cable can be radially inserted into the respective cable port 15 through the access 140a present in the respective single elastically deformable element 140. This can be made without requiring the operator to decouple the inner structure 13, and in particular the supporting frame 132, from the outer structure 11. In other words, in this case, of the inner assembly 130, only the appropriate sealing module 14 is removed. Then, the appropriate sealing module 14 can be coupled again to the respective supporting portion 17 of the supporting frame 132. In particular, the first rigid member 142a and the second rigid member 142b can be axially approached by tightening the bolt 183. This causes the cable to be sealed into the cable port 15.

According to this last option, individual sealing modules 14 can be removed without disturbing cables already installed in other cable ports 15 of the telecommunications enclosure 1. Also, cable installation can be performed by removing less pieces so that there are less pieces for the operator to put back together. This facilitates the installation operation and reduces the number of potential mistakes an operator can make.

Accordingly, in this second embodiment, in the disassembled condition of the base 10, of the inner assembly 130:
- the inner structure 12 as well as the second parts 14b with the rigid members 142a, 142b of the sealing modules 14 are removed from the inner opening 12 (FIG. 5a); or
- the inner structure 12 together with the sealing modules 14 as a whole is removed from the inner opening 12 (FIG. 5b); or
- only the appropriate sealing module(s) 14 as a whole is (are) removed from the inner opening 12 (alternative not shown of variant of FIG. 5b).

When the base 10 is in an assembled condition and the cable ports 15 are not used, they may be closed by suitable closure caps (not shown in FIGS. 5-7), as described in connection with the first embodiment.

FIGS. 8-12 show the base 10 according to a third embodiment of the present disclosure.

The base 10 according to this third embodiment comprises the same structural and functional features of the first embodiment of FIG. 2-4 (for which reference is made to what is described above) except as described below. Same reference numbers refer to the same or similar elements of the first embodiment of FIG. 2-4.

This third embodiment mainly differs from the first embodiment for the structural and functional features of the inner structure 13, part of the outer structure 11, part of the sealing modules 14 and the coupling elements 18 to couple the outer structure 11 to the inner structure 13. On the other side, the plurality of receiving portions 16 with recesses 161 of the outer structure 11 and the first parts 14a and the second parts 14b of the sealing modules 14 are substantially the same as in the first embodiment.

In this third embodiment, the outer structure 11 is generally ring shaped with the generally cylindrical inner opening 12 defining the through aperture in the base 10.

In the embodiment shown, the outer structure 11 presents two circumferential free ends 110a, 110b facing to each other. Between the two circumferential free ends 110a, 110b there is defined a radial aperture 12a formed in the ring shape of the outer structure 11. This radial aperture 12a advantageously enable a radial cable insertion within the opening 12.

In another embodiment (not shown), the radial aperture 12a may be absent so that the outer structure 11 has a closed ring shape.

In this third embodiment, the outer structure 11 may comprise-instead of connector 19 of the first embodiment-a support 21 adapted to be coupled to the telecommunications module (not shown). The support 21 is fixed to the first side 11a of the outer structure 11, between two consecutive recesses 161.

In this third embodiment, the outer structure 11 also comprises securing elements 20 fixed to the first side 11a of the outer structure 11 at each recess 161. The securing elements 20 provide a structural support for retention of the cables 6 (and components thereof), once inserted in the respective cable ports 15.

Even if not shown, similar securing elements may also be provided in the first and second embodiment described above with reference to FIGS. 2-4 and 5-7.

In this third embodiment, the inner structure 13 is defined by a closure frame 135.

The closure frame 135 comprises a first portion 135a and a second portion 135b.

Figure 8:
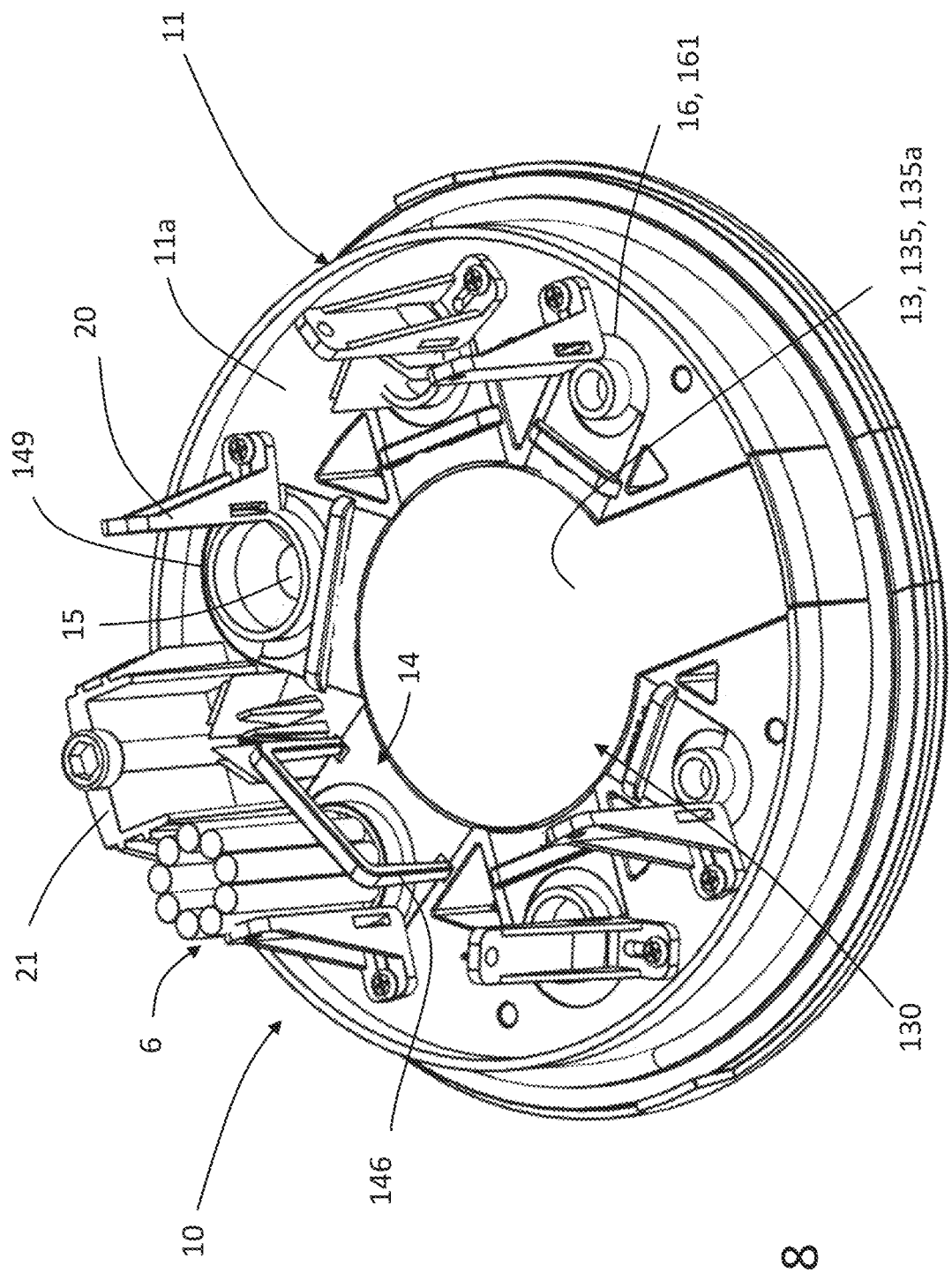
FIG. 8 schematically shows a view of a base of a telecommunications enclosure according to a third embodiment of the present disclosure, wherein the base is in an assembled condition.

The first portion 135a is counter-shaped to the inner opening 12, as defined once the sealing modules 14 are inserted within the respective recesses 161, and to the radial aperture 12a, when present, so as to be inserted inside it/them for closing the same (see, e.g., FIG. 8).

Figure 12:
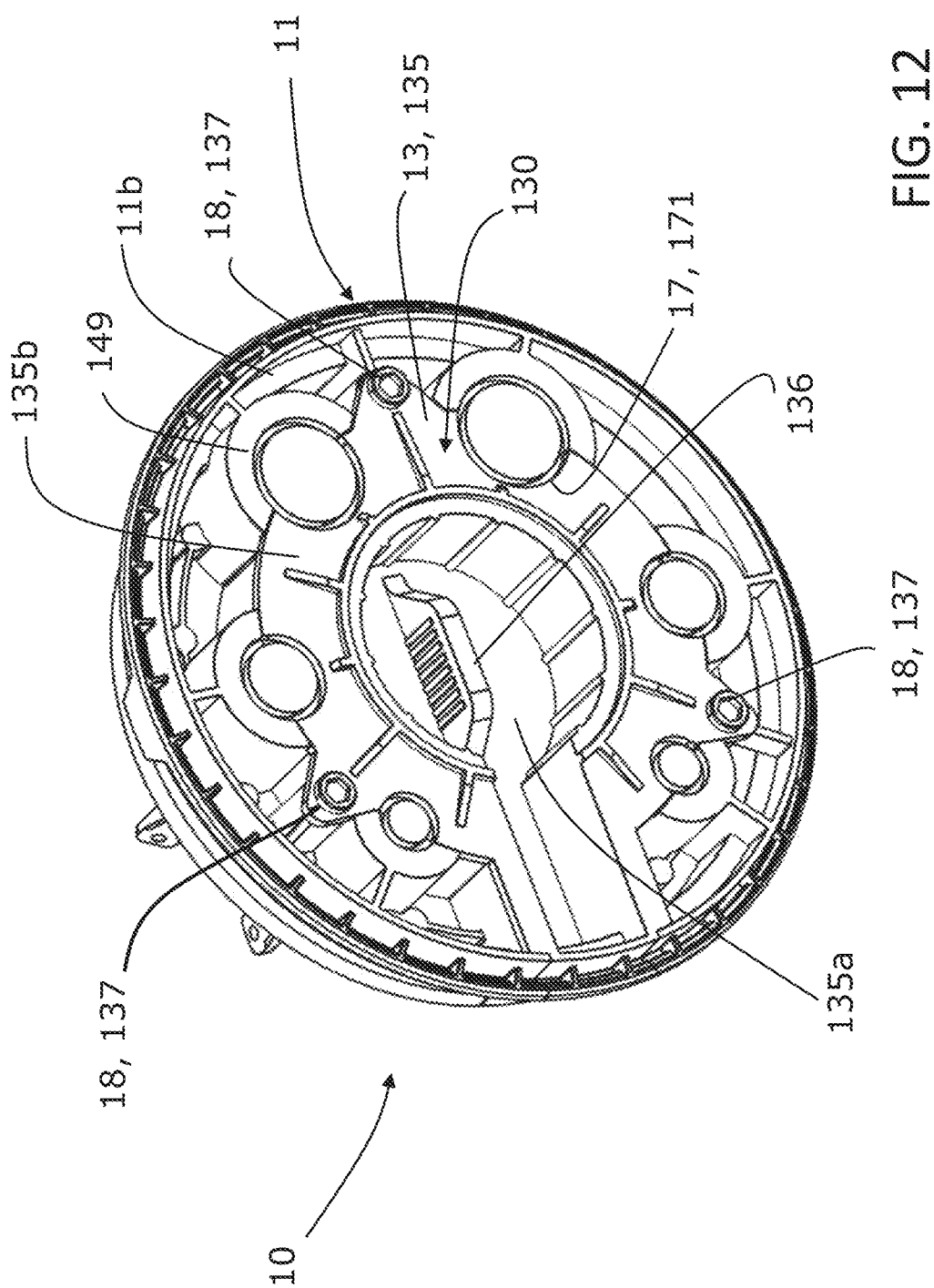
FIG. 12 schematically shows another view of the base of FIG. 8.

On a surface opposite to the casing 2, the first portion 135a has a handle 136 that can be used by an operator to grip the closure frame 135 and to remove the closure frame 135 from the inner opening 12 and the radial aperture 12a, when present (see FIG. 12).

The handle 136 can be provided within a hollow space of the first portion 135a so as to prevent the handle from axially protruding from the base 10.

The second portion 135b surrounds the first portion 135a and develops radially away from the first portion 135a. The second portion 135b is substantially a collar having an annular shape with a central aperture joined to the first portion 135a.

The second portion 135b defines the above-mentioned plurality of supporting portions 17, each having a respective recess 171 formed in a radially outer peripheral region of the second portion 135b (see FIG. 12).

The supporting portions 17 axially blocks the second parts 14b of the sealing modules 14 from moving along a direction away from the casing 2, while the recesses 171 allow the cables to axially cross the second portion 135b of the closure frame 135.

In this third embodiment, the inner structure 13 is removably coupled to the outer structure 11 through the second portion 135b of the closure frame 135. The second portion 135b is connected to the outer structure 11 at the second side 11b of the outer structure 11, for example, by means of bolts 137. Such bolts 137 define the above-mentioned coupling elements 18 and are provided in place of the support bar 181 and bolt 182 of the first embodiment.

Figure 10A:
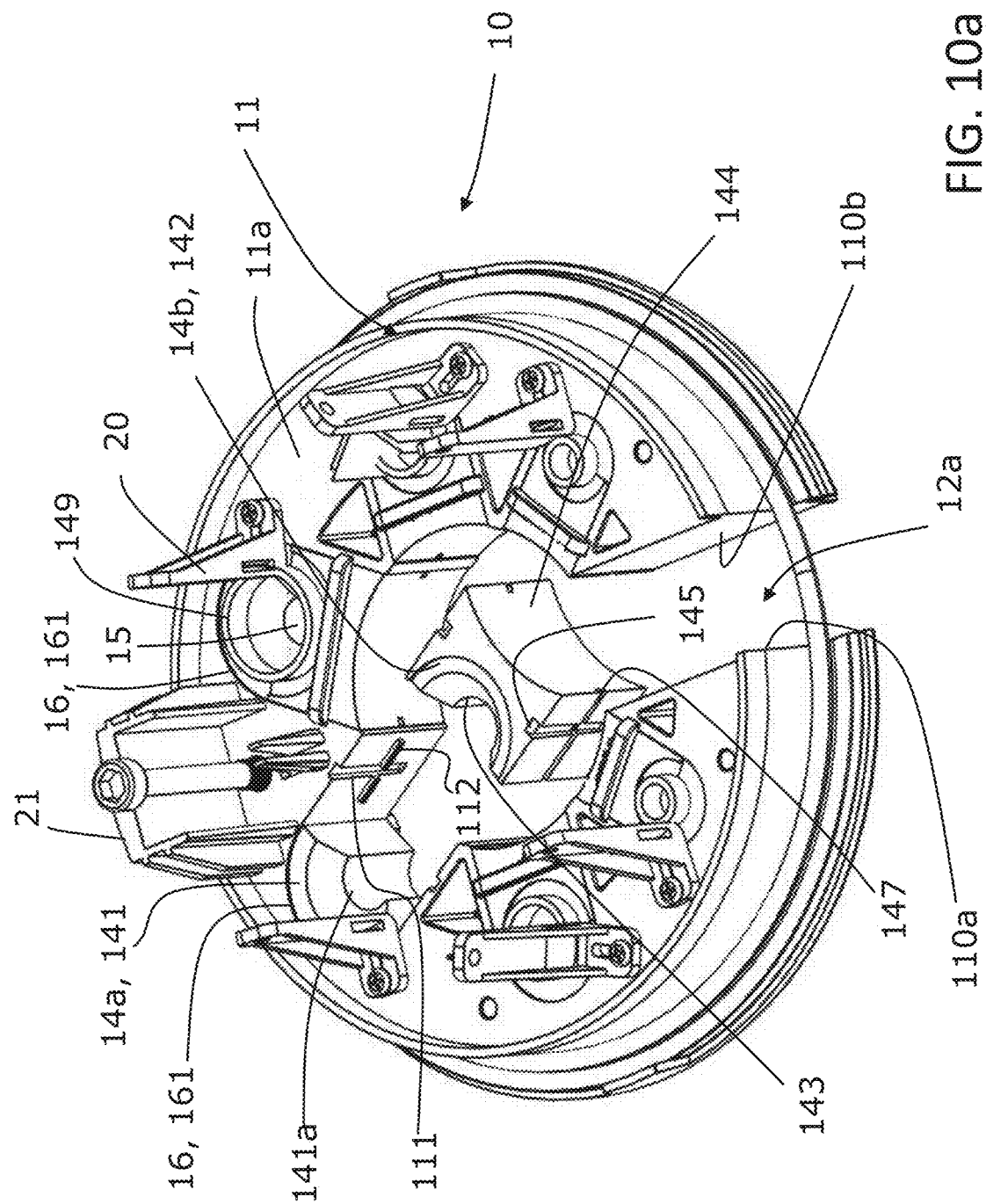
FIG. 10a schematically shows the base of FIG. 9 wherein the second part and the slider of a sealing module are slidingly decoupled from a respective recess of the outer structure, according to a first variant of the third embodiment.
Figure 11:
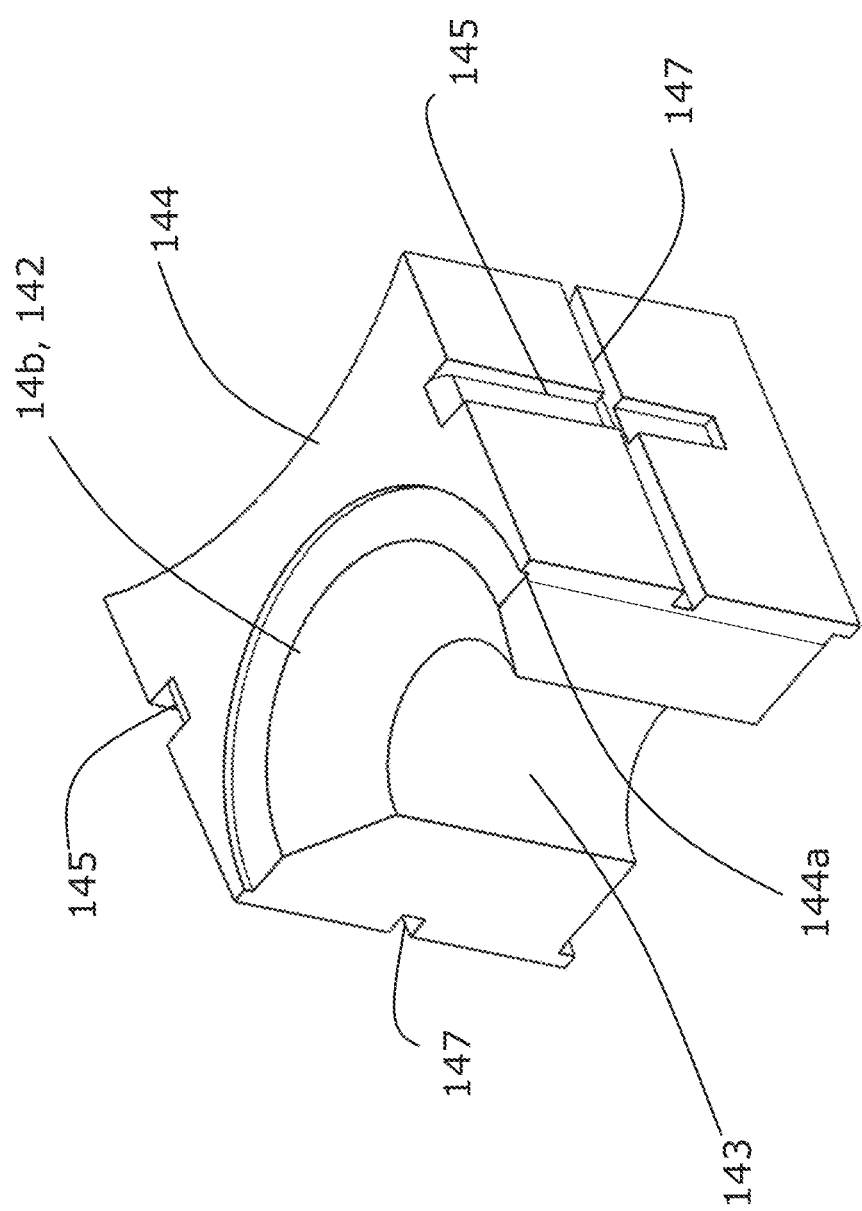
FIG. 11 schematically shows the second part with the slider of the sealing module of FIG. 10a, which is decoupled from the respective recess.

Similarly to the first embodiment, in a first variant shown in FIGS. 10a and 11, the first part 14a and the second part 14b of each sealing module 14 are separable from each other. The first part 14a comprises a first elastically deformable element 141 comprising a radially inner surface and radially outer surface. The radially inner surface of the first elastically deformable element 141 have a semi-cylindrical shape or a double tapered shape and comprise a semi-circular indent 141a defining an axial aperture. The second part 14b of each sealing module 14 comprises a second elastically deformable element 142 having a semi-cylindrical shape or a tapered sloped shape and comprise a semi-circular indent 143 defining an axial aperture (see e.g. FIGS. 10a and 11).

The semi-circular indent 143 of the second elastically deformable element 142 of each second part 14b matches with the semi-circular indent 141a of the first elastically deformable element 141 of the respective first part 14a so as to define a through hole for the respective cable port 15.

The first elastically deformable element 141 and the second elastically deformable element 142 are adapted to seal a cable into the relevant cable port 15 by surrounding and contacting the cable and by exerting a radially compressing force on the cable 6. This advantageously enables to inhibit the intrusion of moisture or other contaminants at the cable ports 15 where the cables 6 enter and exit the telecommunications enclosure 1. Such a radially compressing force exerted by the first elastically deformable element 141 and the second elastically deformable element 142 can be achieved by providing the semi-circular indents 141a, 143 with dimension that define a through hole with a diameter less than the diameter of the cable.

In the first variant of the third embodiment, the second part 14b of each sealing module 14 is slidingly and radially insertable—as shown in FIG. 10a—within the respective recess 161 of the plurality of receiving portions 16 of the outer structure 11.

In particular, as shown in detail in FIG. 11, each sealing module 14 comprises a slider 144, which is coupled to the respective second elastically deformable element 142 and to the respective recess 161 of the plurality of receiving portions 16 of the outer structure 11, and is adapted to be slidingly and radially inserted within the respective recess 161.

Each slider 144 is made of rigid material like, for example, injection molded, cast or machined engineered plastic (e.g. polypropylene or nylon).

Each slider 144 may be coupled to the respective second elastically deformable element 142 by anchoring the radially outer surface of the second elastically deformable element 142 to a seat 144a of the slider 144.

As visible in FIG. 10a, each recess 161 in the outer structure 11 has a radial extension adapted to house the respective sealing module 14, including the first part 14a, the second part 14b and the slider 144.

In correspondence with an area where the second part 14b and the slider 144 of the sealing module 14 is housed, there are provided two opposite radial projections 112 and two radial grooves 147 designed to slidingly receive the radial projections 112. The radial projections 112 can be provided on the recess 161 and the radial grooves 147 can be defined in the respective slider 144. Alternatively, the radial projections 112 can be provided on the slider 144 and the radial grooves 147 can be defined in the recess 161. The radial grooves 147 and the radial projections 112 guide the radial insertion of the second part 14b and slider 144 of each sealing module 14 within the recess 161.

In correspondence with said area where the second part 14b of the sealing module 14 is housed, each recess 161 has two opposite axial grooves 111 adapted to correspond with axial grooves 145 defined in the respective slider 144 at two opposite sides thereof. The axial grooves 111, 115 intercept and partially interrupt the radial projections 112.

Figure 9:
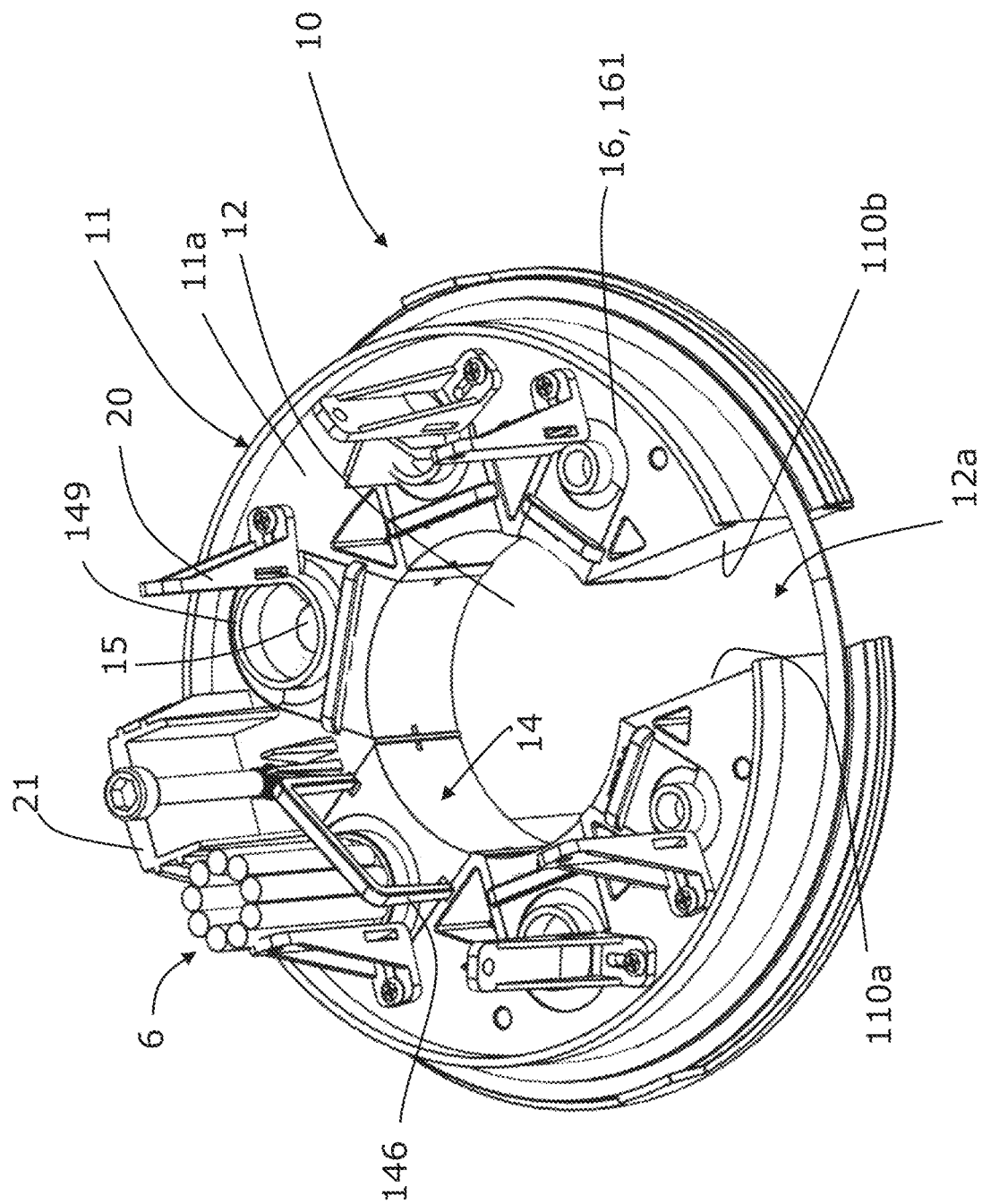
FIG. 9 schematically shows the base of FIG. 8 wherein the inner structure is removed.

As shown in FIG. 9, the slider 144 of each sealing module 14 is connected to the respective recess 161 by means of a connecting member 146. The connecting member 146 is adapted to engage the axial grooves 111 in the recess 161 and the axial grooves 145 in the slider 144 for preventing the slider 144 from sliding along the radial projections 112. For example, the connecting member 146 has the shape of a square bracket.

Similarly to the first variant of the first embodiment, in the first variant of the third embodiment particularly shown in FIGS. 10a and 11, in the assembled condition of the base 10, the first part 14a and the second part 14b of each sealing module 14 are coupled to each other to define the respective cable port 15, while in the disassembled condition of the base 10, the first part 14a and the second part 14b of each sealing module 14 are separated from each other to enable radial insertion of the cable into the respective cable port 15. In particular, the first part 14a of each sealing module 14 is received in the respective recess 161 of the plurality of receiving portions 16 of the outer structure 11 both in the assembled condition and in the disassembled condition of the base 10.

The second part 14b of each sealing module 14 is coupled to the inner structure 13 and to the outer structure 11 in the assembled condition while in the disassembled condition it is decoupled from the outer structure.

Differently from the first embodiment, in the disassembled condition, the second parts 14b of the sealing modules 14 are decoupled also from the inner structure 13.

Figure 10B:
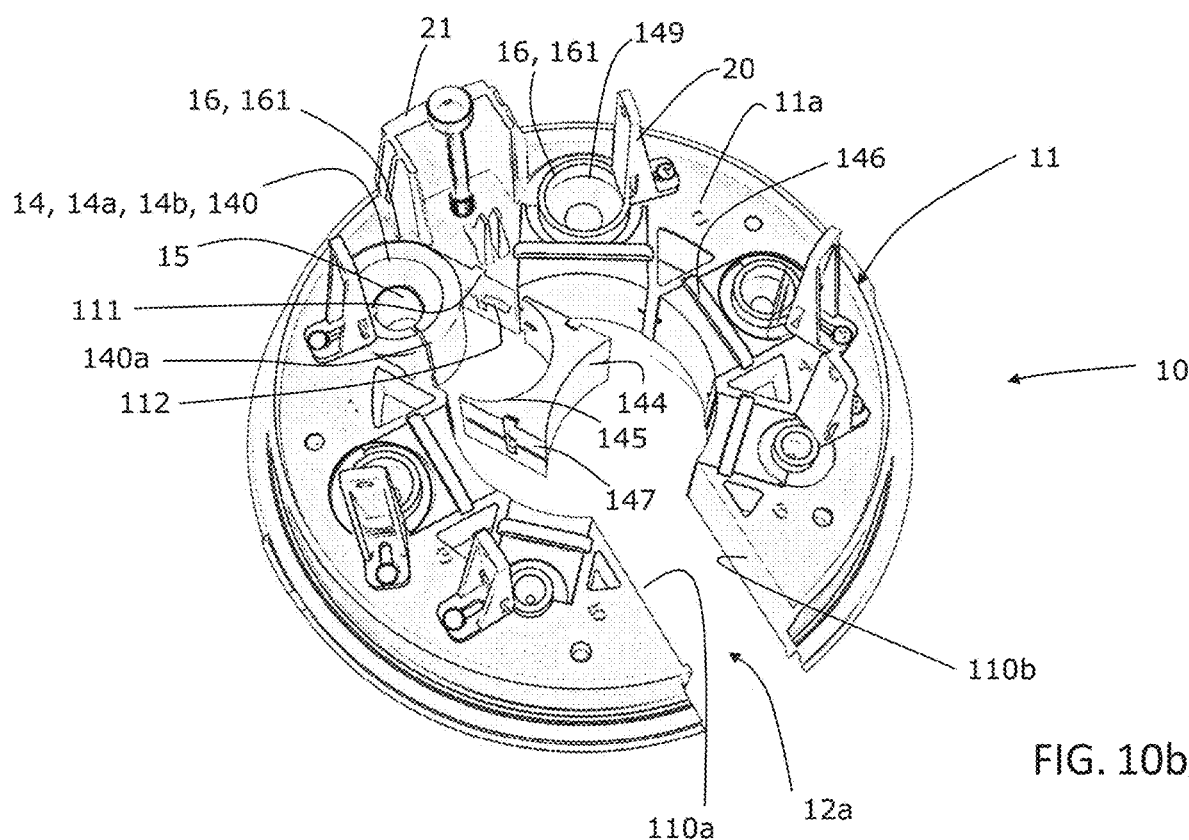
FIG. 10b schematically shows the base of FIG. 9 wherein the slider alone of a sealing module is slidingly decoupled from a respective recess of the outer structure, according to a second variant of the third embodiment.

In a second variant shown in FIG. 10b, which may be advantageous in terms of mechanical strength of the cable port 15, the first part 14a and the second part 14b of each sealing module 14 are made as a single piece (that is, the first part 14a and the second part 14b are not separable from each other), and the first elastically deformable element 141 and the second elastically deformable element 142 are replaced by a single elastically deformable element 140. In this second variant, the single elastically deformable element has a through hole defining the respective cable port 15 and an access 140a (e.g. an axial slit). The access 140a axially opens the whole length of the single elastically deformable element 140 to enable a cable (not shown in FIG. 10b) to radially enter the cable port 15. The through hole has a generally cylindrical shape or a double tapered shape. The single elastically deformable element 140a may be fixed either to the respective recess 161 of the outer structure 11 at the first part 14a of the sealing module 14 (as shown in FIG. 10b) or to the respective slider 144 at the second part 14b of the sealing module 14 (alternative not shown). Apart from these differences, the first part 14a and the second part 14b of each sealing module 14 have the same structural and functional features as described above with reference to the first variant of this third embodiment shown in FIGS. 10a and 11.

In the second variant of FIG. 10b, wherein the first part 14a and the second part 14b of each sealing module 14 are made as a single piece, in the assembled condition of the base 10, the sealing modules 14 are coupled both to the outer structure 11 and to the inner structure 13. In particular, the first parts 14a of the sealing modules 14 are received in the respective recesses 161 of the plurality of receiving portions 16 of the outer structure 11 and the second parts 14b of the sealing modules 14 are coupled to the respective sliders 144, to the inner structure 13 and to the outer structure 11.

In the disassembled condition of the base 10 shown in FIG. 10b, the inner structure 13 is removed from the inner opening 12. All the single elastically deformable elements 140 of the sealing modules 14 remain coupled to the respective recesses 161 of the plurality of receiving portions 16 of the outer structure 11 and decoupled from the inner structure 13. Moreover, the slider(s) 144 involved in cable coupling is (are) decoupled both from the outer structure 11, from the inner structure 13 and from the second part(s) 14b of the respective sealing module(s) 14. The remaining sliders 144 not involved in cable coupling are decoupled from the inner structure 13 but remain coupled to the second parts 14b of the respective sealing modules 14 as well as to the outer structure 11.

According to the alternative not shown wherein each single elastically deformable elements 140 is fixed (that is, irremovably coupled) to the respective slider 144, in the disassembled condition of the base 10 the single elastically deformable element(s) 140 of the sealing module(s) 14 involved in cable coupling remains (remain) coupled to the respective slider(s) 144 and is (are) decoupled both from the outer structure 11 and from the inner structure 13.

In the third embodiment of FIGS. 8-12, when a cable 6 (shown only in FIGS. 8-9) has to be coupled to a cable port 15, the operator first decouples the inner structure 13 (closure frame 135) from the outer structure 11 by acting on the coupling elements 18 and, in particular, on the bolts 137. Then the inner structure 13 (closure frame 135) can be axially removed, with the help of handle 136, from the inner opening 12 (and from the radial aperture 12a, when present) of the outer structure 11. At this point, the slider 144 of the appropriate sealing module 14 can be slidably and radially removed from the respective recess 161 of the outer structure 11 by acting on the connecting member 146 (that is, by axially disengaging the connecting member 146 from the axial grooves 111 in the recess 161 and the axial grooves 145 in the slider 144). In this way, in the first variant of FIG. 10a, the first part 14a and the second part 14b of the sealing module 14 are separated from each other and the cable 6 can be radially inserted either in the first part 14a or in the second part 14b of the appropriate sealing module 14. On the other side, in the second variant, wherein the first part 14a and the second part 14b of each sealing module 14 are made as a single piece, the single elastically deformable element 140 remains coupled either to the slider 144 (alternative not shown) or to the respective recess 161 (alternative shown in FIG. 10b) and the cable can be radially inserted into the respective cable port 15 through the access 140a present in the respective single elastically deformable element 140.

In any case, the slider 144 can be slidably and radially inserted again in the respective recess 161 and secured thereto by using the connecting member 146. Moreover, the inner structure 13 can be axially inserted again into the inner opening 12 (and into the radial aperture 12a, when present). Thereafter, after a proper axial positioning of the cable 6 within the respective cable port 15, the inner structure 13 can be coupled again to the outer structure 11 by means of the bolts 137.

Accordingly, in this third embodiment, in the disassembled condition of the base 10, of the inner assembly 130:
the inner structure 12 as well as the second part 14b with the respective slider 144 of the appropriate sealing module(s) 14 are removed from the inner opening 12 (FIG. 10a); or
the inner structure 12 as well as the slider 144 alone of the appropriate sealing module(s) 14 are removed from the inner opening 12 (FIG. 10b); or
the inner structure 12 as well as the appropriate sealing module(s) 14 as a whole are removed from the inner opening 12 (alternative not shown of FIG. 10b).

When the base 10 is in an assembled condition and the cable ports 15 are not used, they may be closed by suitable closure caps 149.

As it will be clear from the above description, the telecommunications enclosure 1 according to the present disclosure, in the various embodiments and variants thereof, advantageously enables to insert of a cable 6 into the respective cable port 15 by removing at least part of the inner assembly 130 from the inner opening 12 of the outer structure 11 of the base 10, the plurality of receiving portions 16 of the outer structure 11 remaining connected to each other in both the assembled condition and disassembled condition of the base 10.

An operator willing to couple a cable 6 to the telecommunications enclosure 2 is thus enabled to access the cable ports 15 by acting only on the inner assembly 130 of the base 10. This may advantageously facilitate the coupling operation of a cable 6 to a cable port 15 especially when the telecommunications enclosure 1 is situated in uncomfortable and cramped locations.

Moreover, the telecommunications enclosure according to the present disclosure, in the various embodiments and variants thereof, may be particularly advantageous in case of mid-span access applications wherein fiber loops are created in the mid-span of a same cable. In these applications, a first portion of the cable upstream the fiber loops enters a telecommunication enclosure via a first cable port while a second portion of the same cable downstream the fiber loops exits the telecommunication enclosure via a second cable port. The fiber loops are housed in suitable splice trays of the telecommunication enclosure. At the fiber loops, a certain number of fibers of the first portion of the cable are broken out to be spliced to fibers of another cable while the remaining fibers remain in the second portion of the cable and exit the telecommunication enclosure via the second cable port. In this case, the telecommunications enclosure according to the present disclosure advantageously provides adjacent, radially accessible cable ports with enough space to enable the first entering portion and the second exiting portion of the same cable to pass.

On the other side, it is noted that a telecommunications enclosure having cable ports with only an axial access would not be suitable for managing entering and exiting portions of a same cable in mid-span access applications.

The invention claimed is:

1. A telecommunications enclosure comprising:
a casing, defining an inner cavity for housing a telecommunications module, and
a base adapted to be removably coupled to the casing to close the casing, the base comprising:
an outer structure having an inner opening;
an inner assembly comprising an inner structure, adapted to be removably inserted within the inner opening of the outer structure, and
a plurality of sealing modules, each comprising a first part and a second part;
wherein the outer structure comprises a plurality of receiving portions each having a recess adapted to receive at least said first part of a respective sealing module of the plurality of sealing modules;
wherein the base is commutable between an assembled condition and a disassembled condition;
wherein in the assembled condition, the sealing modules, the inner structure and the outer structure are coupled to each other, the inner assembly is inserted within the inner opening of the outer structure and, for each sealing module, at least said first part is received in the respective recess, the second part is coupled to the inner structure and said first part and second part define a corresponding cable port;
wherein in the disassembled condition, at least part of the inner assembly is removed from the inner opening of the outer structure to enable insertion of a cable into the respective cable port; and
wherein in both the assembled condition and disassembled condition, the plurality of receiving portions of the outer structure are connected to each other.

2. The telecommunications enclosure according to claim 1, wherein, at least one of the outer structure and the inner structure is configured to circumferentially separate the sealing modules from each other at least in the assembled condition.

3. The telecommunications enclosure according to claim 1, wherein in the disassembled condition of the base, the second part of at least one sealing module is either:
coupled to the outer structure and decoupled from the inner structure; or
decoupled from the outer structure and coupled to the inner structure; or
decoupled both from the outer structure and from the inner structure.

4. The telecommunications enclosure according to claim 1, wherein in the disassembled condition of the base, the first part of at least one sealing module is either:
- coupled to the outer structure and decoupled from the inner structure; or
- decoupled from the outer structure and coupled to the inner structure; or
- decoupled both from the outer structure and from the inner structure.

5. The telecommunications enclosure according to claim 1, wherein the inner structure comprises a plurality of supporting portions, and in the assembled condition of the base, the second part of each sealing module is coupled to a respective supporting portion.

6. The telecommunications enclosure according to claim 5, wherein the inner structure comprises a plurality of recesses formed in a peripheral region of the inner structure and defining said plurality of supporting portions, and wherein, in the assembled condition of the base, the second part of each sealing module is received in a respective recess of said plurality of recesses.

7. The telecommunications enclosure according to claim 1, wherein the first part and the second part of each sealing module are made as a single piece comprising a single elastically deformable element defining the respective cable port.

8. The telecommunications enclosure according to claim 7, wherein each single elastically deformable element has an access to allow the cable to enter the respective cable port.

9. The telecommunications enclosure according to claim 7, wherein each single elastically deformable element has a through hole defining the respective cable port.

10. The telecommunications enclosure according to claim 8, wherein the access of each single elastically deformable element is commutable between an open condition for entering of the cable into the respective cable port and a closed condition.

11. The telecommunications enclosure according to claim 10, wherein the commutations of the access of each single elastically deformable element between the open condition and the closed condition and between the closed condition and the open condition are actuated through an elastic deformation of the access.

* * * * *